(12) United States Patent
Nii et al.

(10) Patent No.: US 6,909,135 B2
(45) Date of Patent: Jun. 21, 2005

(54) SEMICONDUCTOR MEMORY DEVICE

(75) Inventors: Koji Nii, Tokyo (JP); Shoji Okuda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 90 days.

(21) Appl. No.: 10/096,485

(22) Filed: Mar. 13, 2002

(65) Prior Publication Data

US 2002/0175359 A1 Nov. 28, 2002

(30) Foreign Application Priority Data

May 28, 2001 (JP) ....................................... 2001-159277

(51) Int. Cl.$^7$ .............................................. H01L 29/72
(52) U.S. Cl. ...................... 257/297; 257/369; 257/392; 257/393
(58) Field of Search ................................ 257/297, 369, 257/392, 393, 298, 301, 304

(56) References Cited

U.S. PATENT DOCUMENTS 6,642,588 B1 * 11/2003 Porter et al. ................ 257/393

FOREIGN PATENT DOCUMENTS

| JP | 59-084461 | 5/1984 |
|---|---|---|
| JP | 62-8559 | 1/1987 |
| JP | 62-85460 | 4/1987 |
| JP | 2589949 | 12/1996 |
| KR | 1999-017330 | 3/1999 |

OTHER PUBLICATIONS

U.S. Appl. No. 09/900,917, filed Jul. 10, 2001.

* cited by examiner

Primary Examiner—Edward Wojciechowicz
(74) Attorney, Agent, or Firm—Leydig, Voit & Meyer, Ltd.

(57) ABSTRACT

In the semiconductor storage device, a dummy P+ diffusion region which does not contribute to a storage operation is formed in the vicinity of two P+ diffusion regions constituting a storage node. Moreover, a dummy N+ diffusion region which does not contribute to the storage operation is formed in the vicinity of N+ diffusion regions FL210 and FL220 constituting a storage node. Consequently, a part of electrons generated in a P well region PW by irradiation of α rays or neutron rays can be collected into the dummy N+ diffusion region FL250, and a part of holes generated in an N well region NW by the irradiation of the α rays or the neutron rays can be collected into the dummy P+ diffusion region FL150.

21 Claims, 11 Drawing Sheets

US 6,909,135 B2

SEMICONDUCTOR MEMORY DEVICE

FIELD OF THE INVENTION

The present invention relates to a semiconductor storage device, comprising a SRAM (Static Random Access Memory) memory cell, enhancing tolerance to a soft error.

BACKGROUND OF THE INVENTION

In recent years, it has been desired that the thicknesses and sizes of electronic apparatuses be reduced and the functions operate at a high speed. Such electronic apparatuses include microcomputers having a memory with a large capacity and a high speed. In order to rapidly spread personal computers and enhance their performance to implement higher speed processing, an increase in the capacity of cache memory has been required.

For a RAM, a DRAM (Dynamic RAM) and a SRAM are generally used. The SRAM is usually used for high speed processing as in the cache memory. For the structure of a memory cell of the SRAM, there have been known a high resistance load type constituted by four transistors and two high resistance elements and a CMOS type constituted by six transistors. In particular, since a CMOS type SRAM has a high reliability because of a very small leakage current during data hold, it is a the mainstream SRAM type.

FIG. 10 is an equivalent circuit diagram showing a memory cell of a conventional CMOS type SRAM. In FIG. 10, a PMOS transistor P1 and an NMOS transistor N1 constitute a first CMOS inverter. Moreover, a PMOS transistor P2 and an NMOS transistor N2 constitute a second CMOS transistor. An input/output terminal is complementarily connected between the first and second CMOS inverters.

More specifically, the MOS transistors P1, P2, N1 and N2 constitute a flip-flop circuit. In FIG. 10, a logical state can be written and read in a storage node NA as an output point of the first CMOS inverter and an input point of the second CMOS inverter and a storage node NB as an output point of the second CMOS inverter and an input point as the first CMOS inverter.

Moreover, NMOS transistors N3 and N4 function as access gates respectively. The NMOS transistor N3 has a gate connected to a word line WL, a source connected to the storage node NA, and a drain connected to a positive phase bit line BL1. Moreover, the NMOS transistor N4 has a gate connected to the word line WL, a source connected to the storage node NB, and a drain connected to a negative phase bit line BLB.

In other words, a storage value held in the storage node NA or NB can be read by selecting the word line WL, the positive phase bit line BL, and the negative phase bit line BLB.

FIG. 11 is a diagram showing an example of the layout structure of the conventional SRAM memory cell illustrated in FIG. 10. As shown in FIG. 11, one SRAM memory cell is formed on an N type well region NW and a P type well region PW which are formed on a semiconductor substrate. The PMOS transistors P1 and P2 shown in the equivalent circuit are formed in the same N well region NW and the NMOS transistors N1 to N4 are formed in the same P well region PW.

In FIG. 11, the PMOS transistor P1 sets P+ diffusion regions FL100 and FL110 formed by implanting a P type impurity to be source and drain regions respectively and sets a gate region between the P+ diffusion regions FL100 and FL110 and a polysilicon wiring layer PL110. Similarly, the PMOS transistor P2 sets P+ diffusion regions FL100 and FL120 formed by implanting a P type impurity to be source and drain regions respectively and sets a gate region between the P+ diffusion regions FL100 and FL120 and a polysilicon wiring layer PL120. In other words, the PMOS transistors P1 and P2 share the P+ diffusion region FL100 as the source region.

In FIG. 11, moreover, the NMOS transistor N1 sets N+ diffusion regions FL200 and FL210 formed by implanting an N type impurity to be source and drain regions respectively and sets a gate region between the N+ diffusion regions FL200 and FL210 and a polysilicon wiring layer PL110. Similarly, the NMOS transistor N2 sets N+ diffusion regions FL200 and FL220 formed by implanting an N type impurity to be source and drain regions respectively and sets a gate region between the N+ diffusion regions FL200 and FL220 and the polysilicon wiring layer PL120. In other words, the NMOS transistors N1 and N2 share the N+ diffusion region FL200 as the source region.

Moreover, the NMOS transistor N3 sets N+ diffusion regions FL230 and FL210 formed by implanting an N type impurity to be source and drain regions respectively and sets a gate region between the N+ diffusion regions FL230 and FL210 and a polysilicon wiring layer PL140. In other words, the NMOS transistors N1 and N3 share the N+ diffusion region FL210 as the source region.

Furthermore, the NMOS transistor N4 sets N+ diffusion regions FL240 and FL220 formed by implanting an N type impurity to be source and drain regions respectively and sets a gate region between the N+ diffusion regions FL240 and FL220 and a polysilicon wiring layer PL130. In other words, the NMOS transistors N2 and N4 share the N+ diffusion region FL220 as the drain region.

In the above-mentioned structure, furthermore, the polysilicon wiring layer PL110 also functions as a wiring for connecting the gate regions of the PMOS transistor P1 and the NMOS transistor N1. Similarly, the polysilicon wiring layer PL120 also functions as a wiring for connecting the gate regions of the PMOS transistor P2 and the NMOS transistor N2.

Moreover, at least one contact (connecting hole) is formed in each of the P+ diffusion regions FL100, FL110 and FL120, the N+ diffusion region FL200, FL210, FL220, FL230 and FL240 and the polysilicon wiring layers PL110, PL120, PL130 and PL140. In order to implement the connecting structure of the equivalent circuit shown in FIG. 10, the contacts are connected to each other through an upper wiring layer such as a metal.

Referring to the upper wiring layer for connecting the contacts, various structure have been proposed. For easy understanding, FIG. 11 simply shows a connection wiring between the contacts in a thick solid line. As shown in FIG. 11, the P+ diffusion region FL110, the N+ diffusion region FL210 and the polysilicon wiring layer PL120 are electrically connected through the upper wiring layer, thereby forming the storage node NA, and the P+ diffusion region FL120, the N+ diffusion region FL220 and the polysilicon wiring layer PL110 are electrically connected through the upper wiring layer, thereby forming the storage node NB.

In FIG. 11, moreover, the P+ diffusion region FL100 is connected to a VDD line to be a power line through the contact and the upper wiring layer, and the N+ diffusion region FL200 is connected to a GND line to be a grounding line through the contact and the upper wiring layer.

Moreover, the N+ diffusion regions FL230 and FL240 are electrically connected to the positive phase bit line BL and the negative phase bit line BLB through the contact and the upper wiring layer, respectively. Furthermore, the polysilicon wiring layers PL130 and PL140 are electrically connected to the word line WL through the contact and the upper wiring layer.

FIG. 11 shows the SRAM memory cell according to an example of the layout structure for one bit. Next, explanation will be given about the layout structure of a cell array by providing a plurality of SRAM memory cells. FIG. 12 is a diagram showing an example of the layout structure of a memory cell array constituted by the conventional SRAM memory cell. In particular, FIG. 12 shows a plurality of SRAM memory cells provided in a matrix for three adjacent bits. In FIG. 12, common portions to those in FIG. 11 have the same reference numerals and description thereof will be omitted.

As shown in FIG. 12, the SRAM memory cells shown in FIG. 11 are alternately arranged with a variation in a direction by 180 degrees in a multi-bit structure in which a plurality of SRAM memory cells are provided. For example, a memory cell MC1 is inverted with respect to an X axis on upper side of a memory cell MC0. Similarly, a memory cell MC2 is inverted with respect to the X axis on the lower side of a memory cell MC0. As shown in FIG. 12, moreover, the memory cells MC0 and MC1 are formed by sharing one well region NW1, and the memory cells MC0 and MC2 are formed by sharing one well region PW2.

More specifically, if the boundary of the adjacent memory cells is an N well, the P+ diffusion region forming each of the storage nodes NA and NB is formed in a common N well region. Similarly, if the boundary of the adjacent memory cells is a P well, the N+ diffusion region forming each of the storage nodes NA and NB is formed in a common P well region.

Next, the operation of the conventional SRAM memory cell will be described. In the equivalent circuit of FIG. 10, for example, if the storage node NA is set in an electric potential state having a logical level of "H", the storage node NB is brought into an electric potential state having a logical level of "L" and is thus stabilized. To the contrary, if the storage node NA is set in the electric potential state having the logical level of "L", the storage node NB is brought into the electric potential state having the logical level of "H" and is thus stabilized. Thus, the memory cell constituted by the complementary connection of the CMOS inverters has two different stable logical states depending on whether the two storage nodes NA and NB are set in the "H" or "L" state, and holds the logical state as one-bit hold data.

Thus, the semiconductor storage device constituted by the CMOS inverter has a very high stability and has no drawback in noise resistance. However, when a memory cell for one bit is caused to be finer in order to implement a memory cell array having a large capacity in which a large number of memory cells are integrated, there is a problem of a soft error in that the data held in the storage node are inverted due to electrons generated by incident α rays or neutrons from the universe.

In particular, the soft error more readily occurs when the source voltage is decreased. In a recent semiconductor storage device which can enhance low-power driving, therefore, increasing the tolerance, i.e., resistance, to soft error is an important theme.

A mechanism for the data inversion caused by the soft error will be briefly described below. First of all, when the α rays or the neutrons are particularly irradiated toward a well in a semiconductor layer of the semiconductor storage device, a large number of electron and hole pairs are generated in the well. The electron and hole pairs thus generated are collected into a diffusion region in accordance with an electric potential distribution generated by a PN junction between the well and the diffusion region. In the P well region, particularly, the electrons in the generated electron and hole pairs are collected into the N+ diffusion region in the same P well region and drop the electric potential of the N+ diffusion region. In the N well region, moreover, the holes in the generated electron and hole pairs are collected into the P+ diffusion region in the same N well region and drop the electric potential of the P+ diffusion region.

In the case in which the N+ diffusion region collecting the electrons or the P+ diffusion region collecting holes is the storage node and the collected electrons or holes have a critical charge quantity or more in the diffusion region, the data held in the storage node are inverted by the electrons or the holes. More specifically, the contents stored and held in the semiconductor storage device are changed due to the irradiation by the α rays and the neutrons in some cases. For this reason, there is a problem in that an initial storage state cannot be completely complemented.

SUMMARY OF THE INVENTION

It is an object of the present invention to provide a semiconductor storage device in which the tolerance of a soft error can be enhanced by provision of dummy diffusion and well regions for distributing electron and hole pairs generated by the irradiation of α rays and neutron rays.

The semiconductor storage device according to one aspect of the present invention comprises a transistor storage circuit including a first well region having a first conductivity type; a first impurity diffusion region formed on the first well region, wherein the first impurity diffusion region having a second conductivity type which is different from the first conductivity type; a second well region formed adjacent to the first well region, the second well region having the second conductivity type; and a second impurity diffusion region formed on the second well region, the second impurity diffusion region having the first conductivity type. Moreover, a third impurity diffusion region is formed on the first well region. This third impurity diffusion region has the second conductivity type, and it does not constitute the transistor storage circuit. Moreover, a fourth impurity diffusion region is formed on the second well region. The fourth impurity diffusion region has the first conductivity type, and it does not constitute the transistor storage circuit.

According to the above aspect of this invention, a dummy third impurity diffusion region (P+ diffusion region) which does not contribute to a storage operation is formed in addition to the first impurity diffusion region (P+ diffusion region) constituting a storage node over the first well region (N well region), and furthermore, a dummy fourth impurity diffusion region (N+ diffusion region) which does not contribute to the storage operation is formed in addition to the second impurity diffusion region (N+ diffusion region) constituting a storage node over the second well region (P well region). Therefore, electrons or holes generated in the first well region and the second well region by the irradiation of α rays or neutron rays can be distributed into the dummy third impurity diffusion region and the dummy fourth impurity diffusion region, respectively.

The semiconductor storage device according to another aspect of the present invention comprises a plurality of transistor storage circuits each including a first well region having a first conductivity type; a first impurity diffusion region formed on the first well region, wherein the first impurity diffusion region having a second conductivity type which is different from the first conductivity type; a second well region formed adjacent to the first well region, the second well region having the second conductivity type; and a second impurity diffusion region formed on the second well region, the second impurity diffusion region having the first conductivity type. The transistor storage circuits are provided such that the first well region of one transistor storage circuit and the second well region of other transistor storage circuit are positioned opposite to each and shared. Moreover, a third impurity diffusion region is formed to be shared by the oppositely provided transistor storage circuits over the shared first well region. This third impurity diffusion region has the second conductivity type, and it does not constitute the transistor storage circuits. Moreover, a fourth impurity diffusion region is formed to be shared by the oppositely provided transistor storage circuits over the shared second well region. This fourth impurity diffusion region has the first conductivity type, and it does not constitute the transistor storage circuits.

According to the above aspect of this invention, a plurality of transistor storage circuits (memory cells) are provided to constitute a memory cell array and the dummy third impurity diffusion region (P+ diffusion region) which does not contribute to the storage operation and the dummy fourth impurity diffusion region (N+ diffusion region) which does not contribute to the storage operation are shared by the adjacent memory cells. Therefore, the storage node of the mutual memory cells is divided by the dummy impurity diffusion region. In addition, in each memory cell, the electrons or holes generated in the first well region and the second well region by the irradiation of α rays or neutron rays can be distributed into the dummy third impurity diffusion region and the dummy fourth impurity diffusion region, respectively.

The semiconductor storage device according to still another aspect of the present invention comprises a transistor storage circuit including a first well region having a first conductivity type; a first impurity diffusion region formed on the first well region, wherein the first impurity diffusion region having a second conductivity type which is different from the first conductivity type; a second well region formed adjacent to the first well region, the second well region having the second conductivity type; and a second impurity diffusion region formed on the second well region, the second impurity diffusion region having the first conductivity type. Moreover, a third well region is formed adjacent to the first well region. This third well region has the second conductivity type, and it does not constitute the transistor storage circuit. Moreover, a fourth well region is formed adjacent to the second well region. This fourth well diffusion region has the first conductivity type, and it does not constitute the transistor storage circuit.

According to the above aspect of this invention, the dummy third well region (P well region) which does not contribute to the storage operation is formed adjacently to the first well region (N well region) and the dummy fourth well region (N well region) which does not contribute to the storage operation is formed adjacently to the second well region (P well region). Therefore, it is possible to decrease the quantity of electrons or holes generated on the first well region and the second well region corresponding to the quantity of electrons or holes generated on the dummy third well region and the dummy fourth well region by the irradiation of α rays or neutron rays. The semiconductor storage device according to still another aspect of the present invention comprises a plurality of transistor storage circuits each including a first well region having a first conductivity type; a first impurity diffusion region formed on the first well region, wherein the first impurity diffusion region having a second conductivity type which is different from the first conductivity type; a second well region formed adjacent to the first well region, the second well region having the second conductivity type; and a second impurity diffusion region formed on the second well region, the second impurity diffusion region having the first conductivity type. These transistor storage circuits are provided such that the first and second well regions of two transistor storage circuits are positioned opposite to each. Moreover, a third well region is formed adjacent to and in between the first well regions of the two transistor storage circuits. This third well region has the second conductivity type, and it does not constitute the transistor storage circuits. Moreover, a fourth well region is formed adjacent to and in between the second well regions of the two transistor storage circuits. This fourth well region has the first conductivity type, and it does not constitute the transistor storage circuits.

According to the above aspect of this invention, a plurality of transistor storage circuits (memory cells) are provided to constitute a memory cell array and the dummy third well region (P well region) which does not contribute to the storage operation and the dummy fourth well region (N well region) which does not contribute to the storage operation are provided between the adjacent memory cells. Therefore, the storage node of the mutual memory cells is divided by the dummy well region. In addition, in each memory cell, it is possible to decrease the quantity of electrons or holes generated on the first well region and the second well region corresponding to the quantity of electrons or holes generated on the dummy third well region and the dummy fourth well region by the irradiation of α rays or neutron rays.

The semiconductor storage device according to still another aspect of the present invention comprises a plurality of transistor storage circuits each including a first well region having a first conductivity type; a first impurity diffusion region formed on the first well region, wherein the first impurity diffusion region having a second conductivity type which is different from the first conductivity type; a second well region formed adjacent to the first well region, the second well region having the second conductivity type; and a second impurity diffusion region formed on the second well region, the second impurity diffusion region having the first conductivity type. The transistor storage circuits are arranged in a direction which is perpendicular to a boundary line of the first well region and the second well region.

According to the above aspect of this invention, it is possible to decrease the area of a well region increased by conventionally sharing the same well region between the adjacent memory cells. As a result, it is possible to decrease the quantity of electron and hole pairs by the irradiation of α rays or neutron rays.

Other objects and features of this invention will become apparent from the following description with reference to the accompanying drawings.

DESCRIPTION OF THE PREFERRED EMBODIMENTS

Embodiments of a semiconductor storage device according to the present invention will be described below in detail with reference to the drawings. The present invention is not restricted to the preferred embodiments.

To begin with, a semiconductor storage device according to a first embodiment will be described. In the semiconductor storage device according to the first embodiment, the structure of a SRAM memory cell for one bit is such that a dummy P+ diffusion region which does not contribute to a storage operation is formed in the vicinity of a P+ diffusion region constituting a storage node and a dummy N+ diffusion region which does not contribute to the storage operation is formed in the vicinity of an N+ diffusion region constituting a storage node.

Figure 1:
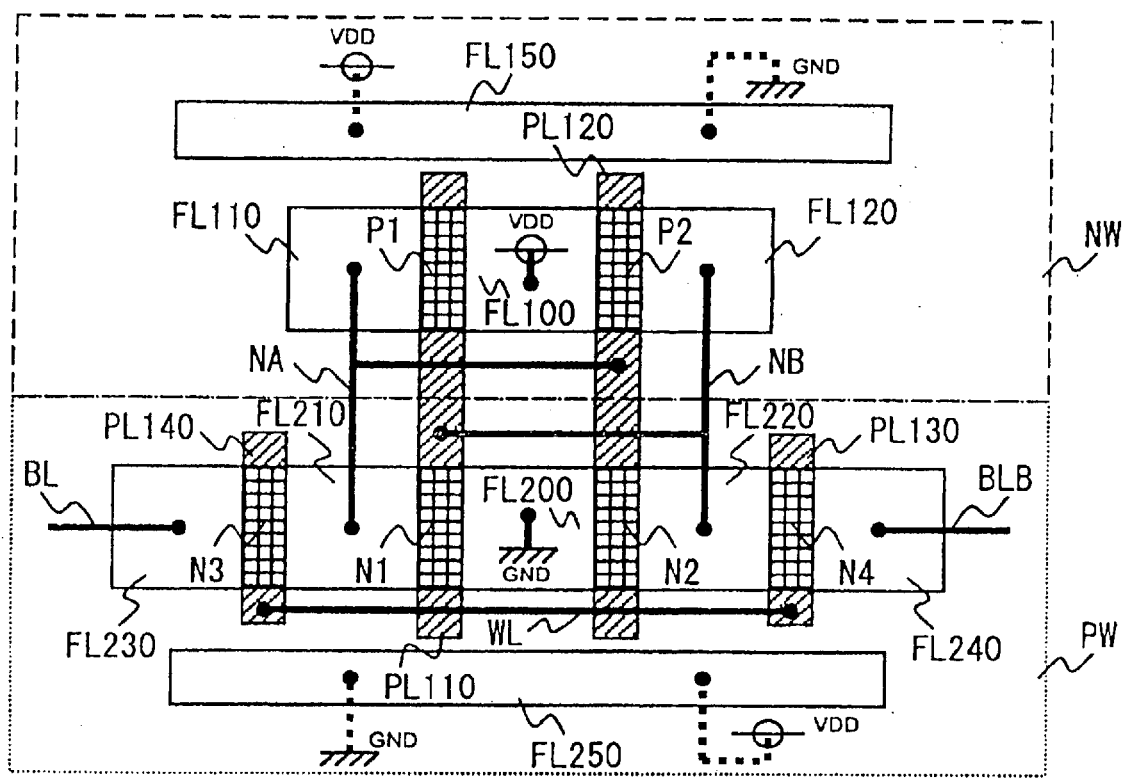
FIG. 1 is a diagram showing an example of the layout structure of a SRAM memory cell constituting a semiconductor storage device according to a first embodiment.
Figure 10:
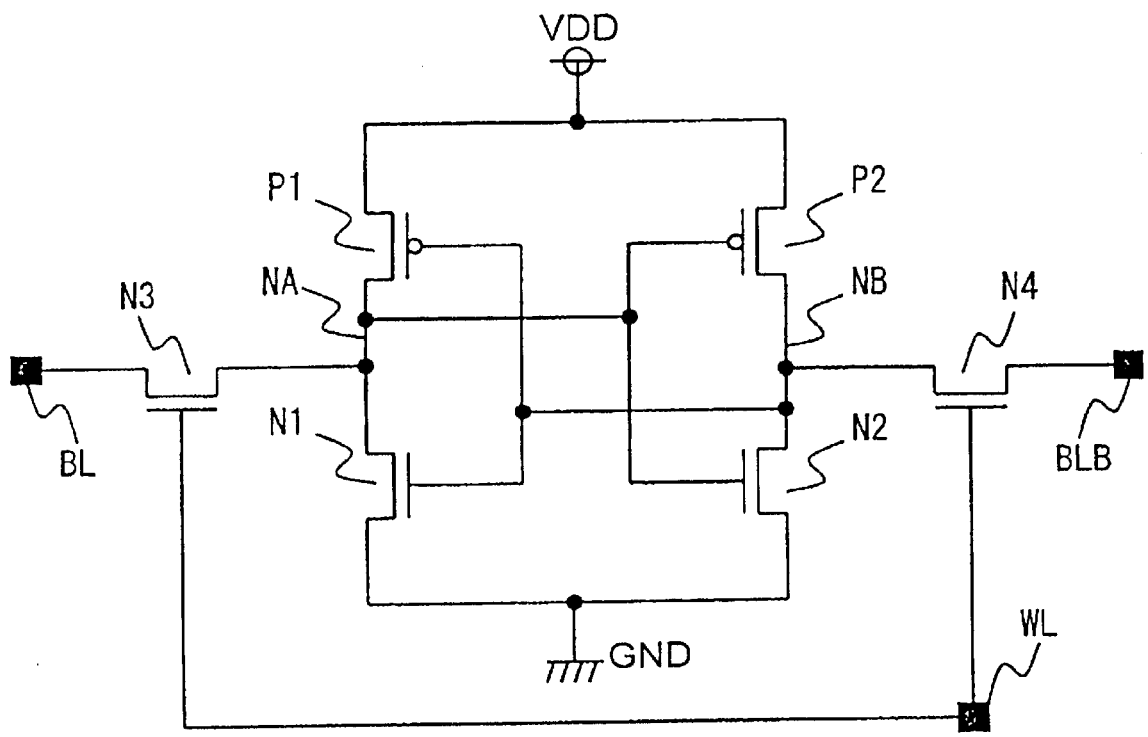
FIG. 10 is an equivalent circuit diagram showing a conventional CMOS type SRAM memory cell.

An equivalent circuit of the SRAM memory cell constituting the semiconductor storage device according to the first embodiment is same as the one shown in FIG. 10. Therefore, in order to avoid simple repetition of explanation, the explanation on the operation of this circuit will be omitted. FIG. 1 is a diagram showing an example of the layout structure of the SRAM memory cell constituting the semiconductor storage device according to the first embodiment. In FIG. 1, common portions to those in FIG. 11 have the same reference numerals and description thereof will be omitted.

In the layout of the SRAM memory cell shown in FIG. 1, a rectangular P+ diffusion region FL150 setting a parallel direction with a boundary line of an N well region NW and a P well region PW to be a longitudinal direction is formed on the N well region NW on the opposite side of the boundary line with respect to P+ diffusion regions FL100, FL110 and FL120 which are positioned on the same line in parallel with the boundary line.

In the layout of the SRAM memory cell, moreover, a rectangular N+ diffusion region FL250 setting a parallel direction with the boundary line of the N well region NW and the P well region PW to be a longitudinal direction is formed on the P well region PW on the opposite side of the boundary line with respect to N+ diffusion regions FL200, FL210, FL220, FL230 and FL240 which are positioned on the same line in parallel with the boundary line.

The P+ diffusion region FL150 and the N+ diffusion region FL250 are dummy patterns in which overlapping portions with a polysilicon wiring layer are not provided and a transistor element is not formed.

Moreover, the dummy N+ diffusion region FL250 can be formed at the same manufacturing step as the steps of manufacturing the N+ diffusion regions FL200, FL210, FL220, FL230 and FL240 which contribute to the storage operation. In other words, an N type impurity ion is implanted into the P well region PW through the same mask so that the N+ diffusion regions FL200, FL210, FL220, FL230, FL240 and FL250 are formed at the same time. Similarly, the dummy P+ diffusion region FL150 can be formed at the same manufacturing step as the steps of manufacturing the P+ diffusion regions FL100, FL110 and FL120 which contribute to the storage operation. In other words, a P type impurity ion is implanted into the N well region NW through the same mask so that the P+ diffusion regions FL100, FL110, FL120, and FL150 are formed at the same time.

It is assumed that a large number of electron and hole pairs are generated in the P well region PW due to α rays discharged from a package or neutron rays discharged from the universe. Since the electrons in the electron and hole pairs generated in the P well region PW are minority carriers in the P well region PW, they are collected into each of the N+ diffusion regions FL200, FL210, FL220, FL230, FL240 and FL250 in accordance with an electric potential distribution between the P well region PW and each of the N+ diffusion regions FL200, FL210, FL220, FL230, FL240 and FL250. In this case, as compared with a conventional layout, the collection of the electrons is distributed corresponding to the area of the N+ diffusion region FL250. In other words, the quantity of electrons to be collected into the other N+ diffusion regions FL200, FL210, FL220, FL230 and FL240 contributing to the storage operation is reduced corresponding to the quantity of electrons collected into the N+ diffusion region FL250.

Similarly, since the holes in the electron and hole pairs generated in the N well region NW are minority carriers in the N well region NW, they are collected into each of the P+ diffusion regions FL100, FL110, FL120 and FL150 in accordance with an electric potential distribution between the N well region NW and each of the P+ diffusion regions FL100, FL110, FL120 and FL150. In this case, as compared with a conventional layout, the collection of the holes is distributed corresponding to the area of the P+ diffusion region FL150. In other words, the quantity of holes to be collected into the other P+ diffusion regions FL100, FL110 and FL120 contributing to the storage operation is reduced corresponding to the quantity of holes collected into the P+ diffusion region FL150.

In the N+ diffusion regions FL110 and FL120 and the P+ diffusion regions FL210 and FL220 which form the storage nodes, particularly, if electrons or holes having a predetermined critical charge quantity or more are collected, there is a danger that the electric potential of the node might be instantaneously changed to invert hold data. As described above, however, the collected electric charges are diffused into the N+ diffusion region FL250 and the P+ diffusion region FL150. Therefore, the critical charge quantity is reached with difficulty. As a result, the tolerance of a soft error can be enhanced.

Moreover, a VDD line or a GND line may be connected to the P+ diffusion region FL150 and the N+ diffusion region FL250 which are newly added, thereby applying a VDD potential or a GND potential to these diffusion regions.

In particular, if the VDD line is connected to the N+ diffusion region FL250, the electric potential of the N+ diffusion region FL250 can be raised to be higher. Therefore, the force for collecting the electrons generated in the P well region PW can be increased. More specifically, as compared with the case in which the VDD line is not connected, the quantity of the electrons to be collected into the other N+ diffusion regions FL200, FL210, FL220, FL230 and FL240 can be reduced and the tolerance of the soft error can be enhanced still more.

As described above, according to the semiconductor storage device of the first embodiment, the dummy P+ diffusion region which does not contribute to the storage operation is formed in the vicinity of the p+ diffusion region constituting the storage node and the dummy N+ diffusion region which does not contribute to the storage operation is formed in the vicinity of the N+ diffusion region constituting the storage node. Therefore, a part of the electrons generated in the P well region by the irradiation of the α rays or the neutron rays can be collected into the dummy N+ diffusion region and a part of the holes generated in the N well region can be collected into the P+ diffusion region by the irradiation of the α rays or the neutron rays. In the P+ diffusion region and the N+ diffusion region which contribute to the storage operation, consequently, it is possible to reduce a possibility that a soft error might be generated, that is, the quantity of the electrons or the holes which are generated by the irradiation of the α rays or the neutron rays might reach the critical charge quantity causing the data inversion.

Next, a semiconductor storage device according to a second embodiment will be described. The semiconductor storage device according to the second embodiment is such that a plurality of SRAM memory cells described in the first embodiment are provided to constitute a memory cell array and the dummy P+ diffusion region and the dummy N+ diffusion region are shared between the adjacent SRAM memory cells.

Figure 2:
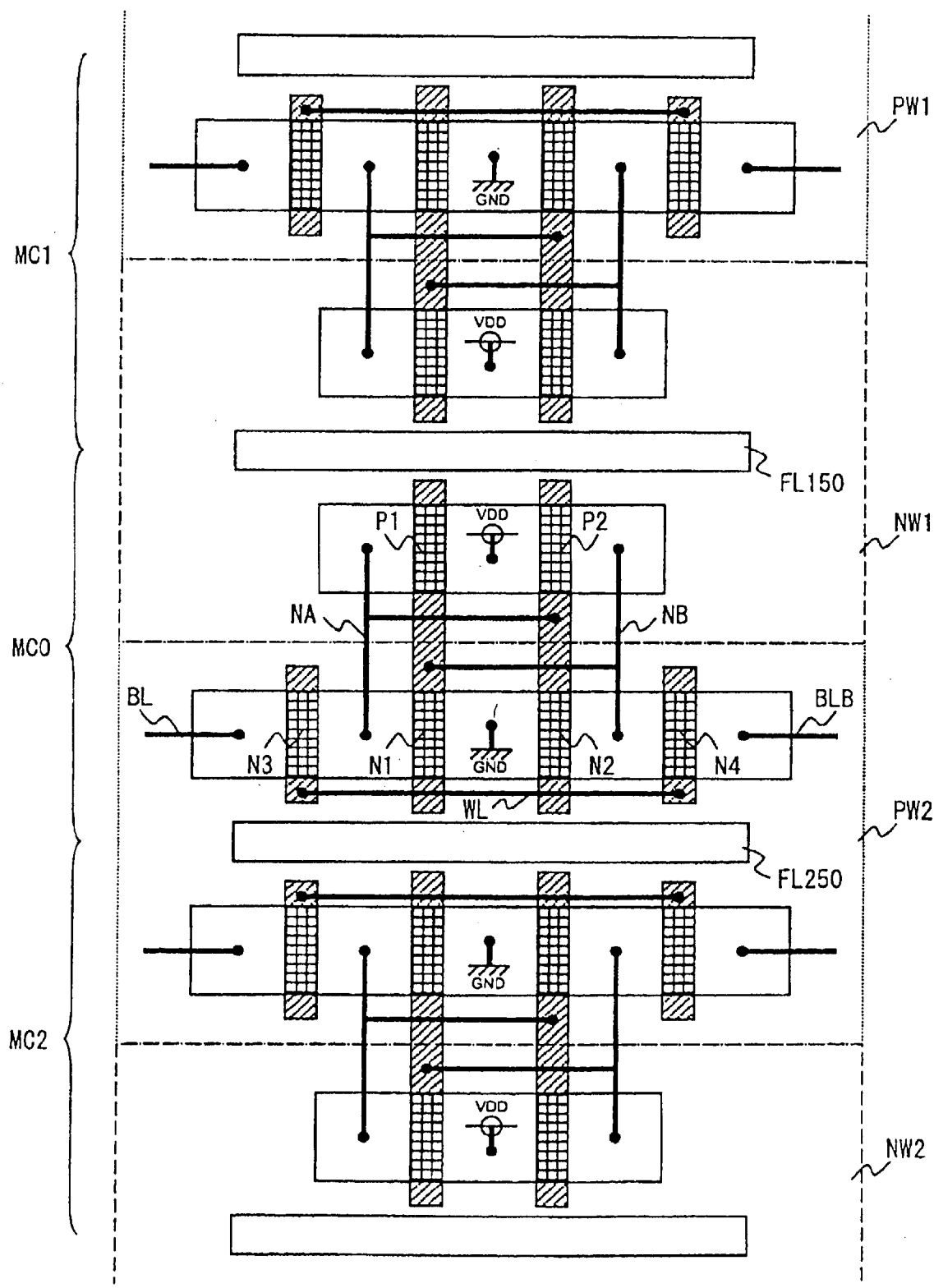
FIG. 2 is a diagram showing an example of the layout structure of a semiconductor storage device according to a second embodiment.

FIG. 2 is a diagram showing an example of the layout structure of the semiconductor storage device according to the second embodiment. In particular, FIG. 2 shows three adjacent bits of plurality of the SRAM memory cells provided in a matrix. In FIG. 2, common portions to those in FIG. 1 and FIG. 12 have been provided with the same reference numerals and description thereof will be omitted.

As shown in FIG. 2, in a multi-bit structure in which a plurality of SRAM memory cells are provided, the SRAM memory cells shown in FIG. 1 are alternately provided with a variation in a direction by 180 degrees. As described with reference to FIG. 12, accordingly, the N type well region NW1 and the P type well region PW1 are shared between adjacent memory cells in a vertical direction of the paper in FIG. 2. In the semiconductor storage device according to the second embodiment, furthermore, the dummy diffusion region to be positioned in the boundary region of the memory cells is shared between the adjacent memory cells.

For example, in FIG. 2, a dummy P+ diffusion region FL150 contributing to a reduction in a soft error is formed on the N well region NW1 between memory cells MC0 and MC1 together. Similarly, a dummy N+ diffusion region FL250 contributing to a reduction in a soft error is formed on the P well region PW2 between memory cells MC0 and MC2 together.

As described above, according to the semiconductor storage device of the second embodiment, the SRAM memory cells described in the first embodiment are provided to constitute a memory cell array and the dummy P+ diffusion region and the N+ diffusion region are shared between the adjacent SRAM memory cells. Therefore, the storage nodes of the mutual SRAM memory cells are isolated by the dummy diffusion region so that the quantity of electric charges collected into the storage node of each SRAM memory cell can be decreased. Similarly, it is possible to reduce a danger of the inversion of 2-bit hold data. As a result, it is possible to reduce a possibility that a multi-bit error might be generated. Furthermore, the dummy diffusion region is shared by the SRAM memory cells. As compared with the case in which the dummy diffusion regions are individually formed, therefore, it is possible to prevent an increase in the area required for forming the dummy diffusion region.

Next, a semiconductor storage device according to a third embodiment will be described. In the semiconductor storage device according to the third embodiment, the structure of a SRAM memory cell for one bit is such that a dummy P well region is formed adjacently to an N well region in which a P+ diffusion region constituting a storage node is provided, and a dummy N well region is formed adjacently to a P well region in which an N+ diffusion region constituting a storage node is provided.

Figure 3:
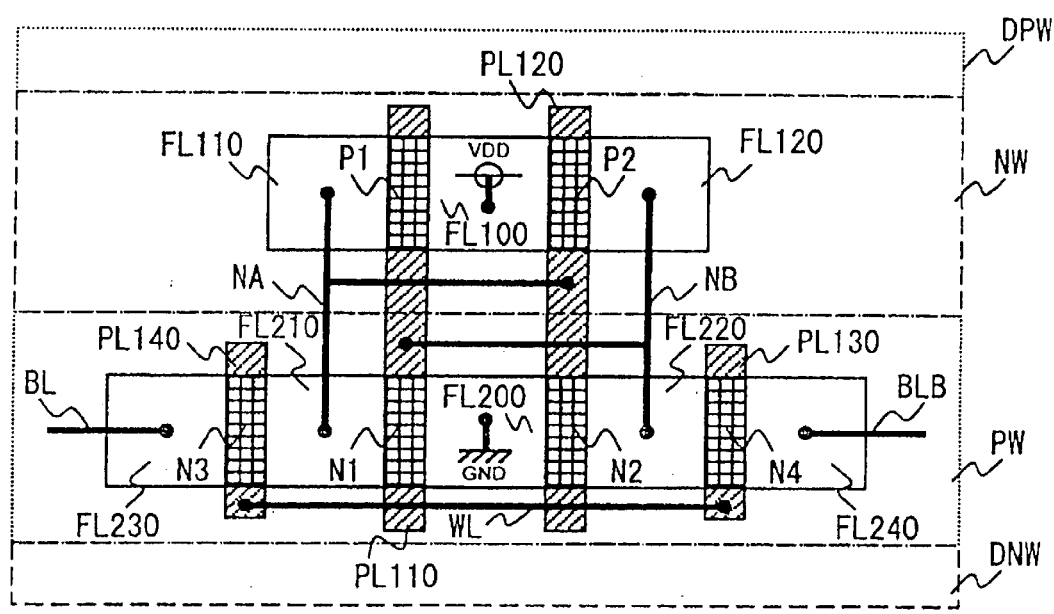
FIG. 3 is a diagram showing an example of the layout structure of a SRAM memory cell constituting a semiconductor storage device according to a third embodiment.

An equivalent circuit of the SRAM memory cell constituting the semiconductor storage device according to the third embodiment is common to that in FIG. 10. Therefore, the operation of the circuit will not be described. FIG. 3 is a diagram showing an example of the layout structure of the SRAM memory cell constituting the semiconductor storage device according to the third embodiment. In FIG. 3, common portions to those in FIG. 11 have the same reference numerals and description thereof will be omitted.

In the layout of the SRAM memory cell shown in FIG. 3, a P well region DPW is formed in a position adjacent to the N well region NW on the opposite side of a boundary line of an N well region NW and a P well region PW with respect to P+ diffusion regions FL100, FL110 and FL120 which are positioned on the same line in parallel with the boundary line. In particular, the P well region DPW is positioned in a portion of the N well region NW in a conventional SRAM memory cell. More specifically, a part of the N well region NW is set to be the P well region DPW in the conventional SRAM memory cell.

In the layout of the SRAM memory cell, moreover, an N well region DNW is formed in a position adjacent to the P well region PW on the opposite side of the boundary line of the N well region NW and the P well region PW with respect to N+ diffusion regions FL200, FL210, FL220, FL230 and FL240 which are positioned on the same line in parallel with the boundary line. In particular, the N well region DNW is positioned in a portion of the P well region PW in the conventional SRAM memory cell. More specifically, a part of the P well region PW is set to be the N well region DNW in the conventional SRAM memory cell.

The P well region DPW and the N well region DNW are dummy well regions in which other semiconductor layers such as a diffusion region or a polysilicon wiring layer are not formed.

Moreover, the dummy N well region DNW can be formed at the same manufacturing step as the step of manufacturing the N well region NW. In other words, an N type impurity ion is implanted into a silicon substrate through the same mask so that the N well regions DNW and NW are formed at the same time. Similarly, the dummy P well region DPW can be formed at the same manufacturing step as the step of manufacturing the P well region PW. In other words, a P type impurity ion is implanted into the silicon substrate through the same mask so that the P well regions DPW and PW are formed at the same time.

It is assumed that a large number of electron and hole pairs are generated in the P well region PW and the N well region DNW due to α rays discharged from a package or neutron rays discharged from the universe. Since the electrons in the electron and hole pairs generated in the P well region PW are minority carriers in the P well region PW, they are collected into each of the N+ diffusion regions FL200, FL210, FL220, FL230 and FL240 in accordance with an electric potential distribution between the P well region PW and each of the N+ diffusion regions FL200, FL210, FL220, FL230 and FL240.

In this case, the electron and hole pairs are generated also in the N well region DNW. However, the holes are the minority carries of the N well region DNW and the N+ diffusion regions FL200, FL210, FL220, FL230 and FL240 constituting the storage node have the same conductivity type as that of the N well region DNW. Therefore, the electron and hole pairs generated in the dummy N well region DNW are not collected into the N+ diffusion regions FL200, FL210, FL220, FL230 and FL240.

In particular, the N well region DNW formed newly is originally provided in the region to be a part of the P well region PW in a conventional layout. In other words, the area of the P well region PW is reduced as compared with the conventional layout. Therefore, the quantity of the electrons to be collected into the other N+ diffusion regions FL200, FL210, FL220, FL230 and FL240 contributing to the storage operation is decreased corresponding to the reduction in the area.

Similarly, since the holes in the electron and hole pairs generated in the N well region NW are minority carriers in the N well region NW, they are collected into each of the P+ diffusion regions FL100, FL110 and FL120 in accordance with an electric potential distribution between the N well region NW and each of the P+ diffusion regions FL100, FL110 and FL120. In this case, the electron and hole pairs are generated also in the P well region DPW. However, the electrons are the minority carries of the P well region DPW and the P+ diffusion regions FL100, FL110 and FL120 constituting the storage node have the same conductivity type as that of the P well region DPW. Therefore, the electron and hole pairs generated in the dummy P well region DPW are not collected into the P+ diffusion regions FL100, FL110 and FL120.

In particular, the P well region DPW formed newly is originally provided in the region to be a part of the N well region NW in the conventional layout. In other words, the area of the N well region NW is reduced as compared with the conventional layout. Therefore, the quantity of the holes to be collected into the other P+ diffusion regions FL100, FL110 and FL120 contributing to the storage operation is decreased corresponding to the reduction in the area.

In the P+ diffusion regions FL110 and FL120 and the N+ diffusion regions FL210 and FL220 which form the storage nodes, particularly, if electrons or holes having a predetermined critical charge quantity or more are collected, there is a danger that the electric potential of the node might be instantaneously changed to invert hold data. As described above, however, the quantity of the electron and hole pairs generated by the formation of the dummy well region is decreased. As a result, the critical charge quantity is reached with difficulty. As a result, the tolerance of a soft error can be enhanced.

Moreover, a VDD line or a GND line may be connected to the P well region DPW and the dummy N well region DNW which are newly added, thereby applying a VDD potential or a GND potential to these well regions.

As described above, according to the semiconductor storage device of the third embodiment, the dummy P well region is formed in a part of the N well region in which the P+ diffusion region constituting the storage node is provided and the dummy N well region is formed in a part of the P well region in which the N+ diffusion region constituting the storage node is provided. Therefore, the area of the N well region in which the P+ diffusion region is formed is reduced and the quantity of the holes generated in the N well region by the irradiation of the α rays or the neutron rays can be decreased. In addition, the area of the P well region in which the N+ diffusion region is formed is reduced and the quantity of the electrons generated in the P well region by the irradiation of the α rays or the neutron rays can be decreased. In the P+ diffusion region and the N+ diffusion region which contribute to the storage operation, consequently, it is possible to decrease the quantity of the electrons or the holes which are generated by the irradiation of the α rays or the neutron rays and to reduce a possibility that the soft error might be generated, that is, the critical charge quantity causing the data inversion might be reached.

Next, a semiconductor storage device according to a fourth embodiment will be described. The semiconductor storage device according to the fourth embodiment is such that a plurality of SRAM memory cells described in the third embodiment are provided to constitute a memory cell array and the dummy P well region and the dummy N well region are shared between the adjacent SRAM memory cells.

Figure 4:
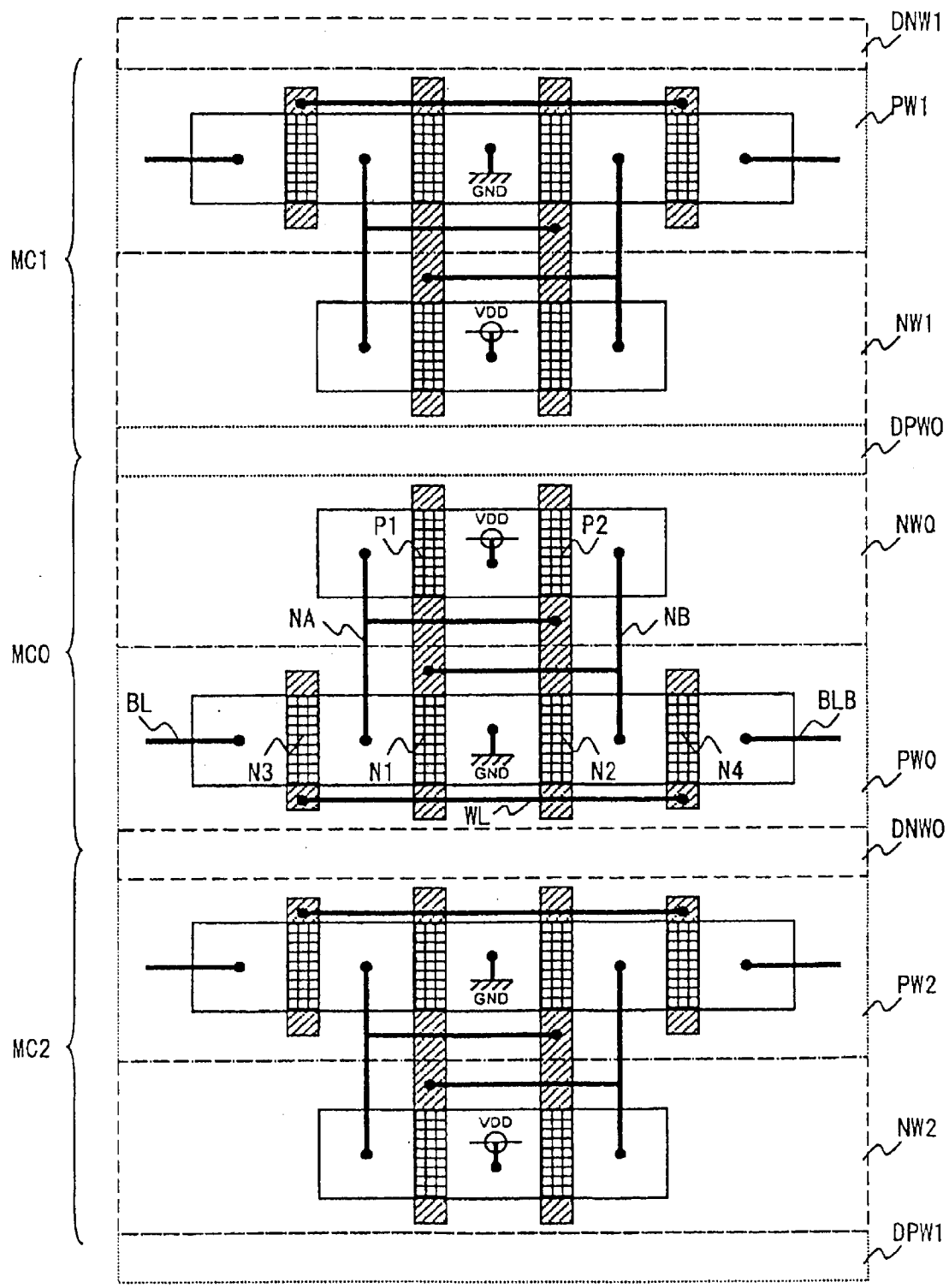
FIG. 4 is a diagram showing an example of the layout structure of a semiconductor storage device according to a fourth embodiment.

FIG. 4 is a diagram showing an example of the layout structure of the semiconductor storage device according to the fourth embodiment. In particular, FIG. 4 shows three adjacent bits of plurality of the SRAM memory cells provided in a matrix. In FIG. 4, common portions to those in FIG. 3 and FIG. 12 have been provided with the same reference numerals and description thereof will be omitted.

As shown in FIG. 4, in a multi-bit structure in which a plurality of SRAM memory cells are provided, the SRAM memory cells shown in FIG. 3 are alternately provided with a variation in a direction by 180 degrees. As described with reference to FIG. 12, accordingly, the N type well region NW1 and the P type well region PW1 are shared between adjacent memory cells in a vertical direction of the paper in FIG. 4. In the semiconductor storage device according to the fourth embodiment, furthermore, the dummy well region to be positioned in the boundary region of each of the memory cells is shared between the adjacent memory cells.

For example, in FIG. 4, a dummy P well region DPW0 contributing to a reduction in a soft error is formed on the N well region NW1 between memory cells MC0 and MC1 together. Similarly, a dummy N well region DNW0 contributing to a reduction in a soft error is formed on the P well region PW2 between memory cells MC0 and MC2 together.

As described above, according to the semiconductor storage device of the fourth embodiment, the SRAM memory cells described in the third embodiment are provided to constitute a memory cell array and the dummy P well region and the dummy N well region are shared between the adjacent SRAM memory cells. Therefore, the storage nodes of the mutual SRAM memory cells are isolated by the dummy well region so that the quantity of electric charges collected into the storage node of each SRAM memory cell can be decreased. Similarly, it is possible to reduce a danger of the inversion of 2-bit hold data. As a result, it is possible to reduce a possibility that a multi-bit error might be generated.

Next, a semiconductor storage device according to a fifth embodiment will be described. The semiconductor storage device according to the fifth embodiment is such that a dummy diffusion region or a dummy well region is shared by not only adjacent memory cells in one direction as shown in FIGS. 2 and 4 but also SRAM memory cells provided in a direction orthogonal to the same direction in the semiconductor storage device according to the second or fourth embodiment.

While explanation will be given about a memory cell array in which a dummy diffusion region is formed as in the second embodiment, the same structure can be implemented also when a dummy well region is formed.

Figure 5A:
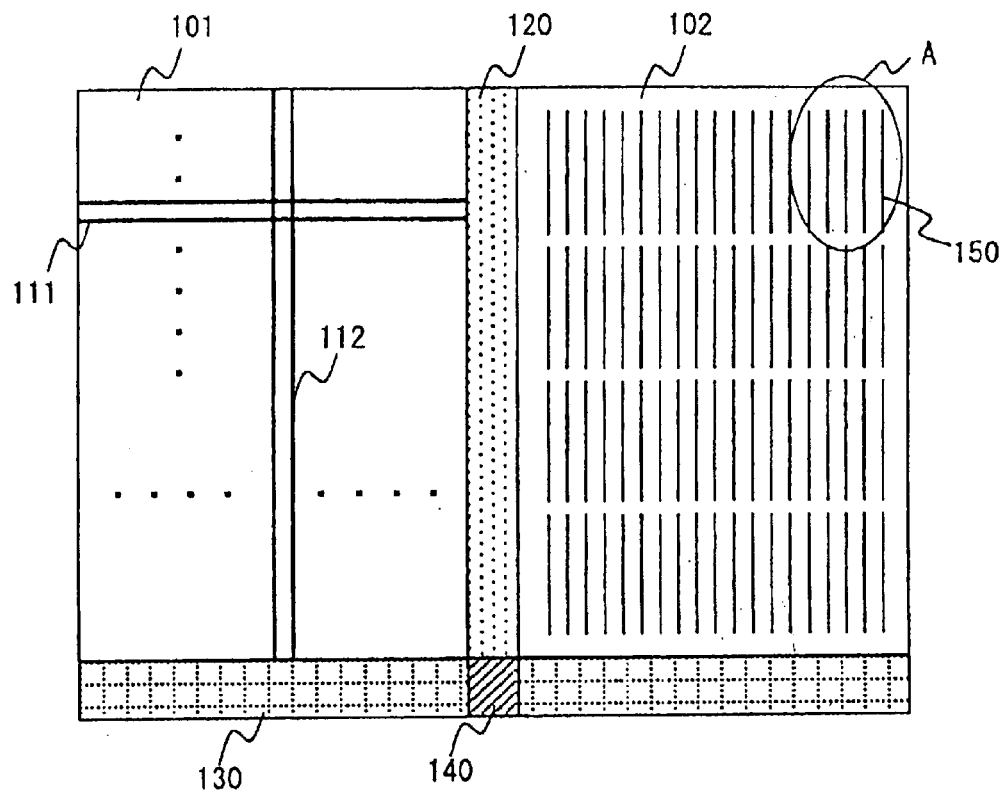
FIG. 5A is a diagram showing an example of the layout structure of a semiconductor storage device according to a fifth embodiment.

FIG. 5 is a diagram showing an example of the layout structure of the semiconductor storage device according to the fifth embodiment. FIG. 5A is a diagram illustrating the whole memory cell array of the semiconductor storage device. The memory cell array shown in FIG. 5A comprises a row decoder 120 for specifying one of a plurality of word lines 111 in accordance with an address input to an address buffer 14 and an I/O interface 130 for specifying one of a plurality of bit lines 112 in accordance with an address input to an address buffer 140 and for reading and writing data through a sense amplifier.

Although the representation in array portions 101 and 102 to be divided into two portions through the row decoder 120 is varied in order to avoid the complexity of FIG. 5A, both array portions have the same structure and a plurality of memory cells provided therein.

Figure 5B:
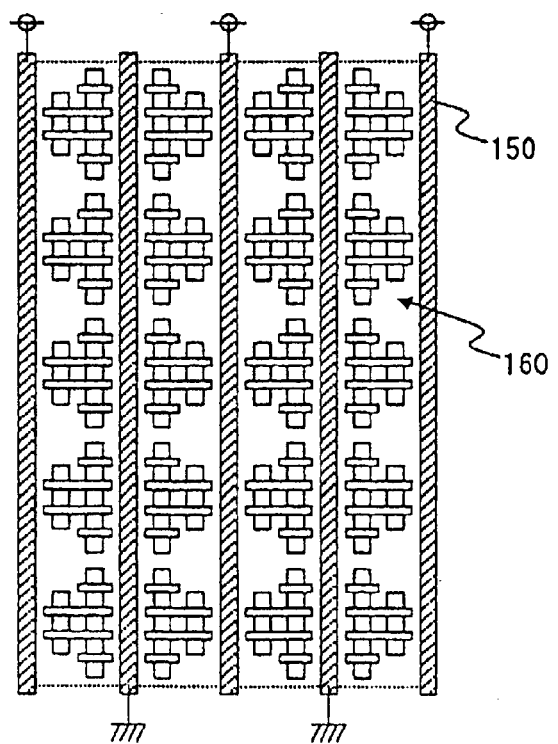
FIG. 5B is an enlarged view of a portion of FIG. 5A.

FIG. 5B is an enlarged diagram showing a region 150 illustrated in FIG. 5A. As shown in FIG. 5B, the dummy diffusion region 150 is shared by not only two memory cells opposed to each other around one axis (hereinafter referred to as X axis) as described in the second embodiment but also a plurality of memory cells provided in the direction of the X axis through an increase in a length in the longitudinal direction of the shape of a strip.

It is sufficient that the number of the memory cells to be shared in the direction of the X axis is two or more. As shown in FIG. 5A, a plurality of dummy diffusion regions to be shared can be formed in the direction of the X axis over the whole memory cell array and a VDD potential or a GND potential can be applied to each diffusion region.

As described above, according to the semiconductor storage device of the fifth embodiment, the dummy diffusion region or the dummy well region is caused to have the shape of a strip which is longer in the longitudinal direction. Consequently, the dummy diffusion region or the dummy well region is shared by not only the two SRAM memory cells opposed to each other but also the SRAM memory cells provided in the direction orthogonal to the opposite direction. Therefore, when the VDD potential or the GND potential is to be applied to the dummy diffusion region or the dummy well region, the number of contacts required for the connection with a VDD line or a GND line can be decreased so that the layout of an upper wiring layer to implement the connection with the contact can be simplified. In addition, the area required for forming the contact or the wiring layer can be reduced. As a result, the size of each memory cell can be reduced.

Next, a semiconductor storage device according to a sixth embodiment will be described. The semiconductor storage device according to the sixth embodiment is such that the dummy diffusion region or dummy well region described in the first to fifth embodiments is formed on a 2-port SRAM memory cell capable of accessing one memory cell from two ports.

Figure 6:
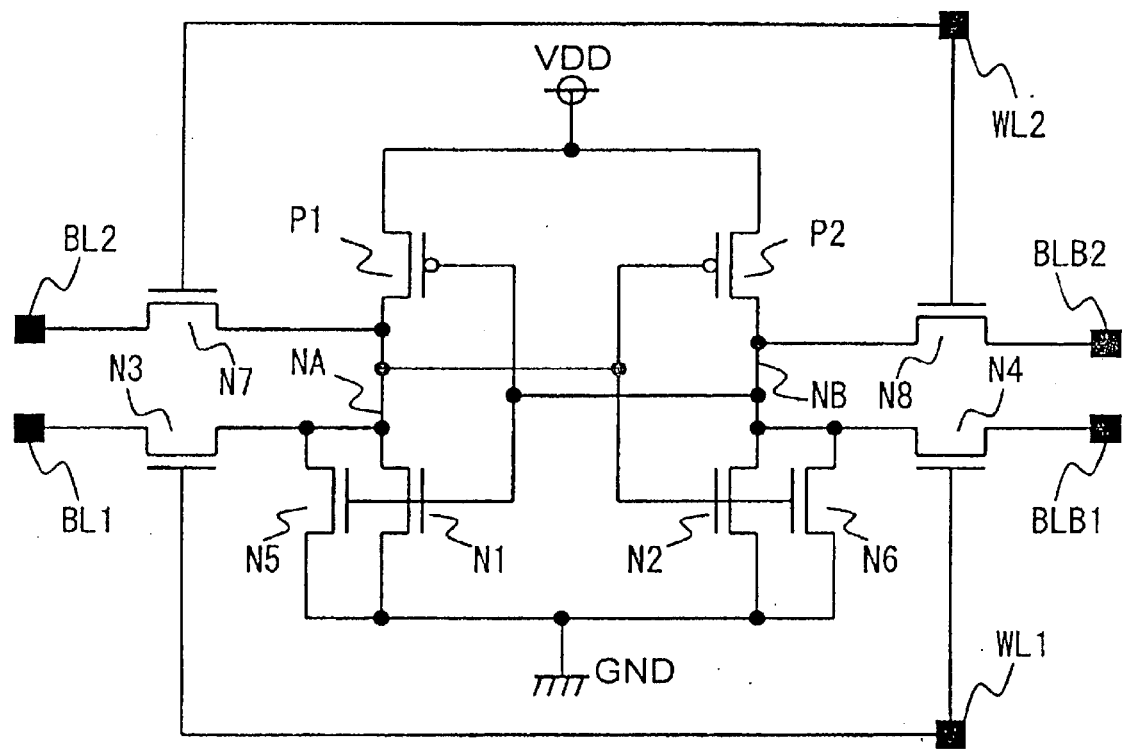
FIG. 6 is a diagram showing an equivalent circuit of a semiconductor storage device according to a sixth embodiment.

FIG. 6 is an equivalent circuit diagram showing the semiconductor storage device according to the sixth embodiment, and particularly, a diagram showing an equivalent circuit of the 2-port SRAM memory cell. In FIG. 6, a PMOS transistor P1 and an NMOS transistor N1 (or N5) constitute a first CMOS inverter and a PMOS transistor P2 and an NMOS transistor N2 (or N6) constitutes a second CMOS transistor, and furthermore, an input/output terminal is complementarily connected between the CMOS inverters.

More specifically, the MOS transistors P1, P2, N1, N2, N5 and N6 constitute a flip-flop circuit. In FIG. 6, data can be written and read in a storage node NA to be an output point of the first CMOS inverter and an input point of the second CMOS inverter and a storage node NB to be an output point of the second CMOS inverter and an input point of the first CMOS inverter.

Moreover, NMOS transistors N3, N4, N7 and N8 function as access gates, respectively. The NMOS transistor N3 has a gate connected to a first word line WL1, a source connected to the storage node NA and a drain connected to a first positive phase bit line BL1. Furthermore, the NMOS transistor N7 has a gate connected to a second word line WL2, a source connected to the storage node NA and a gate connected to a second positive phase bit line BL2.

Moreover, the NMOS transistor N4 has a gate connected to the first word line WL1, a source connected to the storage node NB and a drain connected to a first negative phase bit line BLB1. Furthermore, the NMOS transistor N8 has a gate connected to the second word line WL2, a source connected to the storage node NB and a gate connected to a second negative phase bit line BLB2.

More specifically, hold data can be read through a first port by the selection of the first word line WL1, the first positive phase bit line BL1 and the first negative phase bit line BLB1, and hold data can be read through a second port by the selection of the second word line WL2, the second positive phase bit line BL2 and the second negative phase bit line BLB2.

Although the equivalent circuit itself shown in FIG. 6 is not different from the circuit of a conventional 2-port SRAM memory cell, the semiconductor storage device according to the sixth embodiment is characterized by a layout structure constituting one 2-port SRAM memory cell. In other words, a dummy diffusion region or dummy well region shown in FIG. 1 or 3 is formed on the 2-port SRAM memory cell.

The layout structure of the 2-port SRAM memory cell forming the dummy diffusion region as described in the first embodiment will be described below. As described in the third embodiment, the same effects as those of the third embodiment can be obtained by exchanging the dummy diffusion region with the well region.

Figure 7:
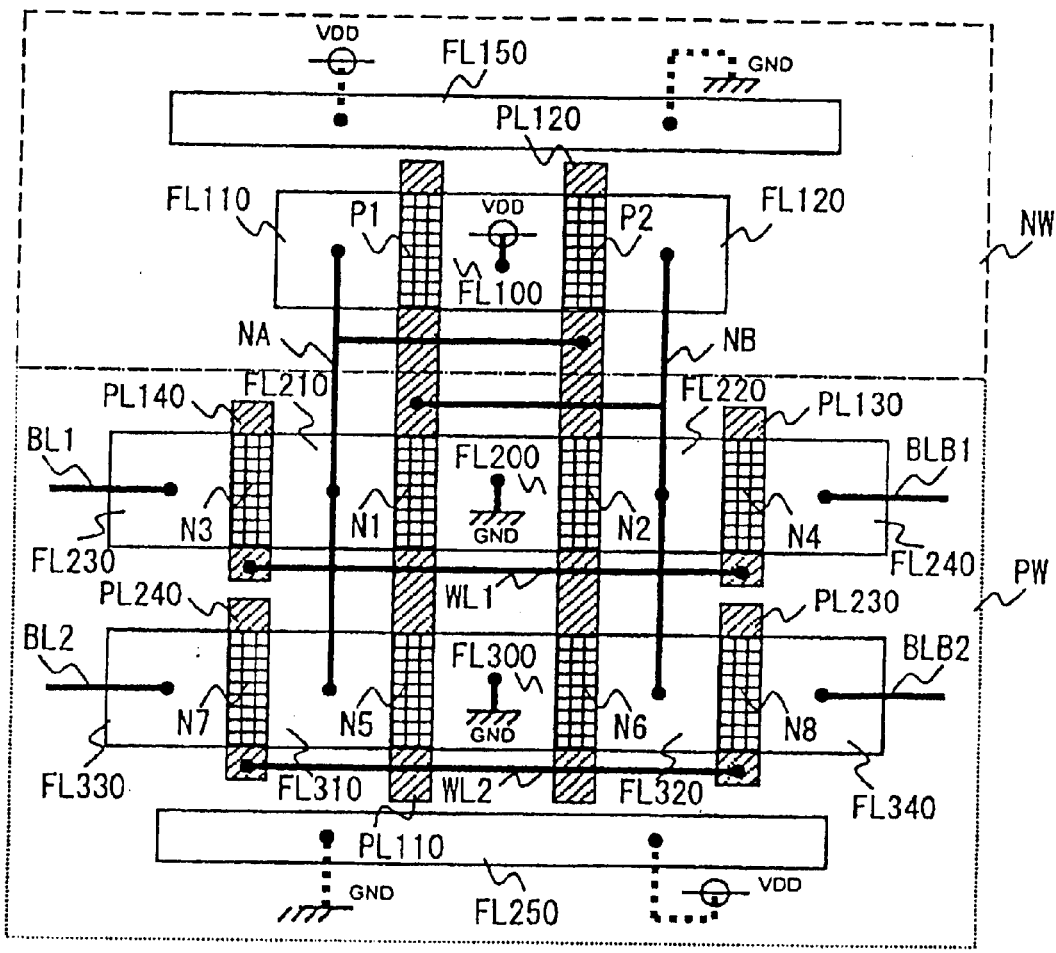
FIG. 7 is a diagram showing an example of the layout structure of a 2-port SRAM memory cell constituting the semiconductor storage device according to the sixth embodiment.

FIG. 7 is a diagram showing an example of the layout structure of a 2-port SRAM memory cell constituting the semiconductor storage device according to the sixth embodiment. As shown in FIG. 7, one 2-port SRAM memory cell is formed on an N type well region NW and a P type well region PW which are provided on a semiconductor substrate. The PMOS transistors P1 and P2 shown in the equivalent circuit of FIG. 6 are formed in the same N well region NW and the NMOS transistors N1 to N8 are formed in the same P well region PW.

In FIG. 7, the PMOS transistor PI sets P+ diffusion regions FL100 and FL110 formed by implanting a P type impurity to be source and drain regions respectively and sets a gate region between the P+ diffusion regions FL100 and FL110 and a polysilicon wiring layer PL110. Similarly, the PMOS transistor P2 sets P+ diffusion regions FL100 and FL120 formed by implanting a P type impurity to be source and drain regions respectively and sets a gate region between the P+ diffusion regions FL100 and FL120 and a polysilicon wiring layer PL120. In other words, the PMOS transistors P1 and P2 share the P+ diffusion region FL100 as the source region.

In particular, the P+ diffusion regions FL100, FL110 and FL120 are positioned on the same line in parallel with a boundary line of the N well region NW and the P well region PW.

In FIG. 7, moreover, the NMOS transistor N1 sets N+ diffusion regions FL200 and FL210 formed by implanting an N type impurity to be source and drain regions respectively a and sets a gate region between the P+ diffusion regions FL200 and FL210 and a polysilicon wiring layer PL110. Similarly, the NMOS transistor N2 sets N+ diffusion regions FL200 and FL220 formed by implanting an N type impurity to be source and drain regions respectively and sets agate region between the P+ diffusion regions FL200 and FL220 and the polysilicon wiring layer PL120. In other words, the NMOS transistors N1 and N2 share the N+ diffusion region FL200 as the source region.

Moreover, the NMOS transistor N3 sets N+ diffusion regions FL230 and FL210 formed by implanting an N type impurity to be source and drain regions respectively and sets a gate region between the P+ diffusion regions FL230 and FL210 and a polysilicon wiring layer PL140. In other words, the NMOS transistors N1 and N3 share the N+ diffusion region FL210 as the drain region.

Furthermore, the NMOS transistor N4 sets N+ diffusion regions FL240 and FL220 formed by implanting an N type impurity to be source and drain regions respectively and sets a gate region between the P+ diffusion regions FL240 and FL220 and a polysilicon wiring layer PL130. In other words, the NMOS transistors N2 and N4 share the N+ diffusion region FL220 as the drain region.

In particular, the N+ diffusion regions FL200, FL210, FL220, FL230 and FL240 are positioned on the same line in parallel with a boundary line of the N well region NW and the P well region PW.

Moreover, the NMOS transistor N5 sets N+ diffusion regions FL300 and FL310 formed by implanting an N type impurity to be source and drain regions respectively and sets a gate region between the P+ diffusion regions FL300 and FL310 and a polysilicon wiring layer PL110. Similarly, the NMOS transistor N6 sets N+ diffusion regions FL300 and FL320 formed by implanting an N type impurity to be source and drain regions respectively and sets a gate region between the P+ diffusion regions FL300 and FL320 and the polysilicon wiring layer PL120. In other words, the NMOS transistors N5 and N6 share the N+ diffusion region FL300 as the source region.

Furthermore, the NMOS transistor N7 sets N+ diffusion regions FL330 and FL310 formed by implanting an N type impurity to be source and drain regions respectively and sets a gate region between the P+ diffusion regions FL330 and FL310 and a polysilicon wiring layer PL240. In other words, the NMOS transistors N5 and N7 share the N+ diffusion region FL310 as the drain region.

Moreover, the NMOS transistor N8 sets N+ diffusion regions FL340 and FL320 formed by implanting an N type impurity to be source and drain regions respectively and sets a gate region between the P+ diffusion regions FL340 and FL320 and a polysilicon wiring layer PL230. In other words, the NMOS transistors N6 and N8 share the N+ diffusion region FL320 as the drain region.

In particular, the N+ diffusion regions FL300, FL310, FL320, FL330 and FL340 are positioned on the same line in parallel with a line where the N+ diffusion regions FL300, FL310, FL320, FL330 and FL340 are positioned and a boundary line of the N well region NW and the P well region PW.

In the above-mentioned structure, furthermore, the polysilicon wiring layer PL110 also functions as a wiring for connecting the gate regions of the PMOS transistor P1 and the NMOS transistors N1 and N5. Similarly, the polysilicon wiring layer PL120 also functions as a wiring for connecting the gate regions of the PMOS transistor P2 and the NMOS transistors N2 and N6.

Moreover, at least one contact (connecting hole) is formed in each of the P+ diffusion regions FL100, FL110 and FL120, the N+ diffusion regions FL200, FL210, FL220, FL230, FL240, FL300, FL310, FL320, FL330 and FL340 and the polysilicon wiring layers PL110, PL120, PL130, PL140, PL230 and PL240. In order to implement the connecting structure of the equivalent circuit shown in FIG. 6, the contacts are connected to each other through an upper wiring layer such as a metal.

Referring to the upper wiring layer for connecting the contacts, various structures have been proposed. In order not to constitute a main part of the present invention and to obtain easy understanding, FIG. 7 simply shows a connection wiring between the contacts in a thick solid line. As shown in FIG. 7, the P+ diffusion region FL110, the N+ diffusion region FL210, N+ diffusion region FL310 and the polysilicon wiring layer PL120 are electrically connected through the upper wiring layer, thereby forming the storage node NA, and the P+ diffusion region FL120, the N+ diffusion region FL220, the N+ diffusion region FL320 and the polysilicon wiring layer PL110 are electrically connected through the upper wiring layer, thereby forming the storage node NB.

In FIG. 7, moreover, the P+ diffusion region FL100 is connected to a VDD line to be a power line through the contact and the upper wiring layer, and the N+ diffusion regions FL200 and FL300 are connected to a GND line to be a grounding line through the contact and the upper wiring layer. Moreover, the N+ diffusion regions FL230 and FL240 are electrically connected to the positive phase bit line BL and the negative phase bit line BLB1 through the contact and the upper wiring layer, respectively. Moreover, the N+ diffusion regions FL330 and FL340 are electrically connected to the positive phase bit line BL2 and the negative phase bit line BLB2 through the contact and the upper wiring, respectively.

Furthermore, the polysilicon wiring layers PL130 and PL140 are electrically connected to the word line WL1 through the contact and the upper wiring layer, and the polysilicon wiring layers PL230 and PL240 are electrically connected to the word line WL2 through the contact and the upper wiring layer.

According to the semiconductor storage device of the sixth embodiment, in the above-mentioned structure, a rectangular P+ diffusion region FL150 setting a parallel direction with the boundary line of the N well region NW and the P well region PW to be a longitudinal direction is formed over the N well region NW on the opposite side of the boundary line with respect to P+ diffusion regions FL100, FL110 and FL120 which are positioned on the same line in parallel with the boundary line.

Furthermore, a rectangular N+ diffusion region FL250 setting a parallel direction with the boundary line of the N well region NW and the P well region PW to be a longitudinal direction is formed in parallel with the boundary line over the P well region PW interposing the N+ diffusion regions FL200, FL210, FL220, FL230 and FL240 and the N+ diffusion regions FL300, FL310, FL320, FL330 and FL340 with respect to the boundary line.

The P+ diffusion region FL150 and the N+ diffusion region FL250 are dummy patterns in which overlapping portions with a polysilicon wiring layer are not provided and a transistor element is not formed.

It is assumed that a large number of electron and hole pairs are generated in the P well region PW due to α rays discharged from a package or neutron rays discharged from the universe. Since the electrons in the electron and hole pairs generated in the P well region PW are minority carriers in the P well region PW, they are collected into each of the N+ diffusion regions FL200, FL210, FL220, FL230, FL240, FL250, FL300, FL310, FL320, FL330 and FL340 in accordance with an electric potential distribution between the P well region PW and the same N+ diffusion regions. In this case, as compared with a conventional layout, the collection of the electrons is distributed corresponding to the area of the N+ diffusion region FL250. In other words, the quantity of electrons to be collected into the other N+ diffusion regions FL200, FL210, FL220, FL230, FL240, FL300, FL310, FL320, FL330 and FL340 contributing to the storage operation is reduced corresponding to the quantity of electrons collected into the N+ diffusion region FL250.

Similarly, since the holes in the electron and hole pairs generated in the N well region NW are minority carriers in the N well region NW, they are collected into each of the P+ diffusion regions FL100, FL110, FL120 and FL150 in accordance with an electric potential distribution between the N well region NW and each of the P+ diffusion regions FL100, FL110, FL120 and FL150. In this case, as compared with a conventional layout, the collection of the holes is distributed corresponding to the area of the P+ diffusion region FL150. In other words, the quantity of holes to be collected into the other P+ diffusion regions FL100, FL110 and FL120 contributing to the storage operation is reduced corresponding to the quantity of holes collected into the P+ diffusion region FL150.

In the P+ diffusion regions FL110 and FL120 and the N+ diffusion regions FL210 and FL220 which form the storage node, particularly, if electrons or holes having a predetermined critical charge quantity or more are collected, there is a danger that the electric potential of the node might be instantaneously changed to invert hold data. As described above, the collected electric charges are diffused into the N+ diffusion region FL250 and the P+ diffusion region FL150. Therefore, the critical charge quantity is reached with difficulty. As a result, the tolerance of a soft error can be enhanced also in the structure of the 2-port SRAM memory cell.

Moreover, a VDD line or a GND line may be connected to the P+ diffusion region FL150 and the N+ diffusion region FL250 which are newly added, thereby applying a VDD potential or a GND potential to these diffusion regions.

In particular, if the VDD line is connected to the N+ diffusion region FL250, the electric potential of the N+ diffusion region FL250 can be raised to be higher. Therefore, the force for collecting the electrons generated in the P well region PW can be increased. More specifically, as compared with the case in which the VDD line is not connected, the quantity of the electrons to be collected into the other N+ diffusion regions FL200, FL210, FL220, FL230, FL240, FL300, FL310, FL320, FL330 and FL340 can be reduced and the tolerance of the soft error can be enhanced still more.

While the dummy N+ diffusion region FL250 is formed in the outer edge portion of the P well region PW constituting the 2-port SRAM memory cell as shown in FIG. 7 in the above description, it may be formed between the N+ diffusion regions FL200, FL210, FL220, FL230 and FL240 and the N+ diffusion regions FL300, FL310, FL320, FL330 and FL340.

Figure 8:
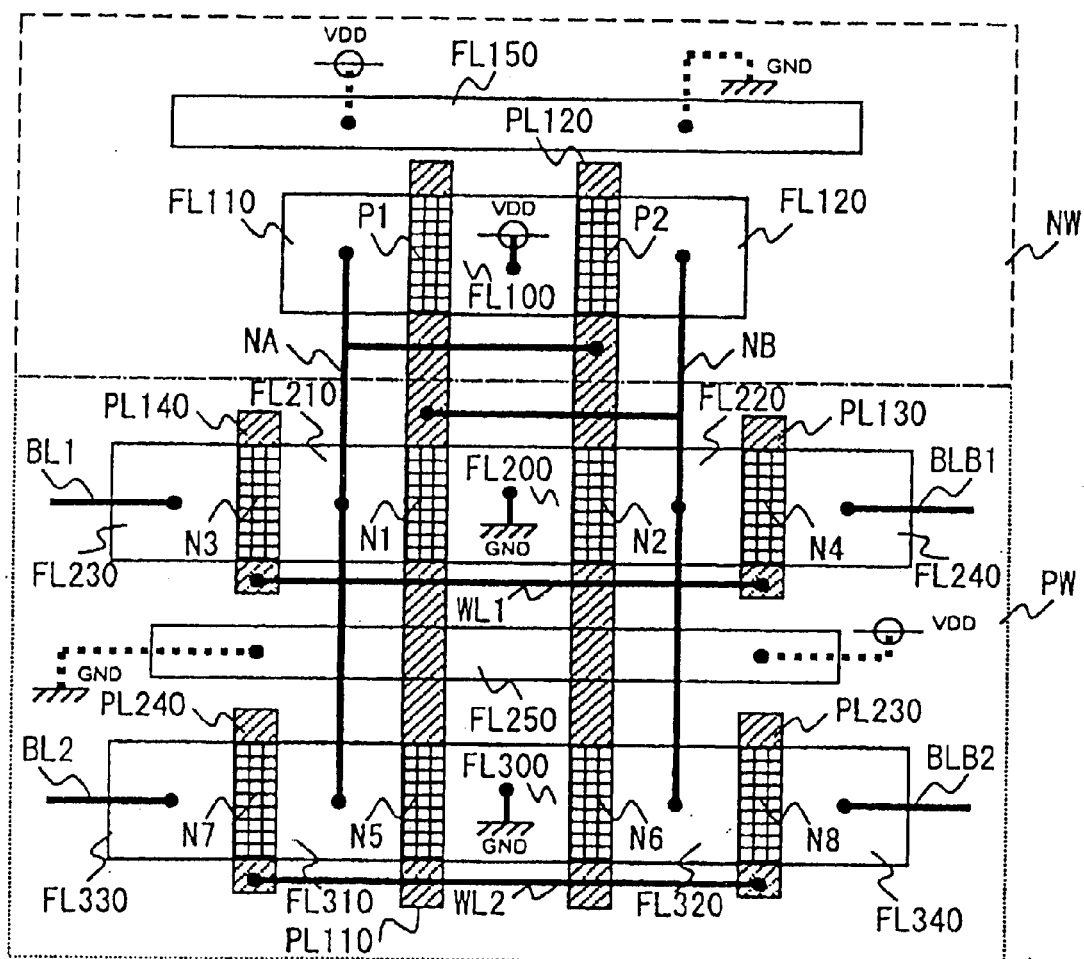
FIG. 8 is a diagram showing another example of the layout structure of the 2-port SRAM memory cell constituting the semiconductor storage device according to the sixth embodiment.

FIG. 8 is a diagram showing a layout structure in this case. In FIG. 8, common portions to those in FIG. 7 have the same reference numerals and description thereof will be omitted. In the layout shown in FIG. 8, particularly, the dummy N+ diffusion region FL250 formed between the N+ diffusion regions FL200, FL210, FL220, FL230 and FL240 and the N+ diffusion regions FL300, FL310, FL320, FL330 and FL340 has no connection relationship with the polysilicon wiring layers PL110 and PL120.

As shown in FIG. 8, particularly, the dummy N+ diffusion region FL250 can be formed in a close position where a distance from a diffusion region zone constituted by the N+ diffusion regions FL200, FL210, FL220, FL230 and FL240 is equal to a distance from a diffusion region zone constituted by the N+ diffusion regions FL300, FL310, FL320, FL330 and FL340. Therefore, electrons originally collected by both diffusion region zones can be collected into the dummy N+ diffusion region FL250 so that the tolerance of a soft error can be more enhanced.

As described above, according to the semiconductor storage device of the sixth embodiment, the dummy P+ diffusion region which does not contribute to the storage operation is formed in the vicinity of the P+ diffusion region constituting the storage node and the dummy N+ diffusion region which does not contribute to the storage operation is formed in the vicinity of the N+ diffusion region constituting the storage node in the layout structure of the 2-port SRAM memory cell. Therefore, the same effects as those in the first embodiment can be obtained.

While the dummy diffusion region is formed in the above-mentioned example, the same effects as those in the third embodiment can be obtained also when a dummy well region is instead formed as described in the third embodiment. Furthermore, when a plurality of 2-port SRAM memory cells described in the sixth embodiment are alternately provided opposite to each other to constitute a memory cell array as shown in FIG. 2 or 4, it is also possible to share and form a dummy diffusion region or a dummy well region between adjacent memory cells in the boundary region between both memory cells as described in the second or fourth embodiment.

Moreover, the structure shown in FIG. 5 and explained in connection to the fifth embodiment may be applied to the 2-port SRAM memory cell described in the sixth embodiment. Consequently, the dummy diffusion region or the dummy well region can also be shared between a plurality of memory cells provided in a direction perpendicular to the direction of the opposite arrangement.

Figure 11:
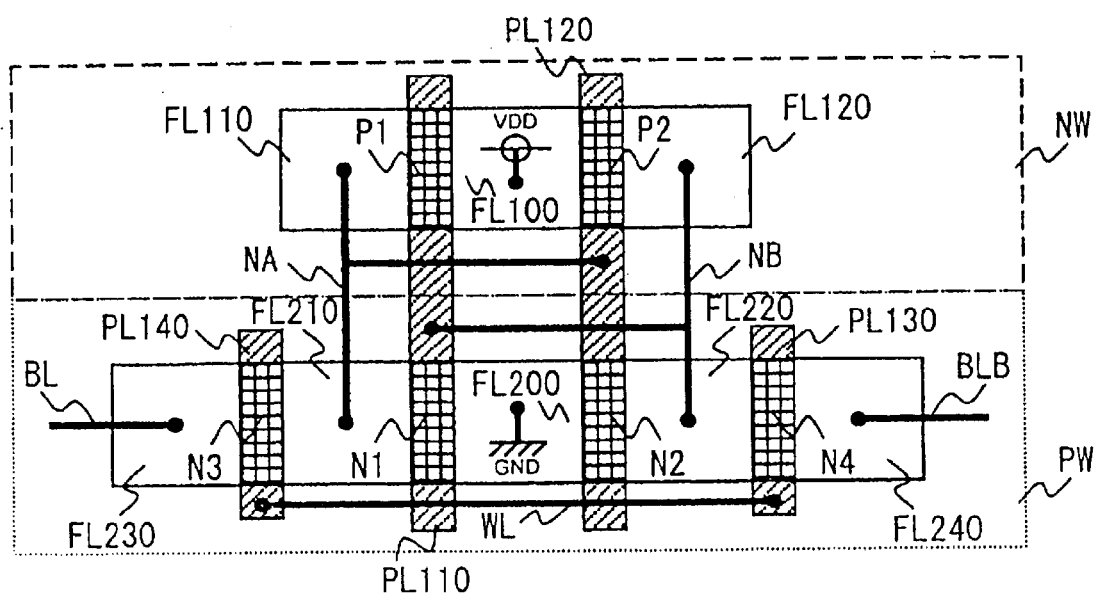
FIG. 11 is a diagram showing an example of the layout structure of a conventional SRAM memory cell.
Figure 12:
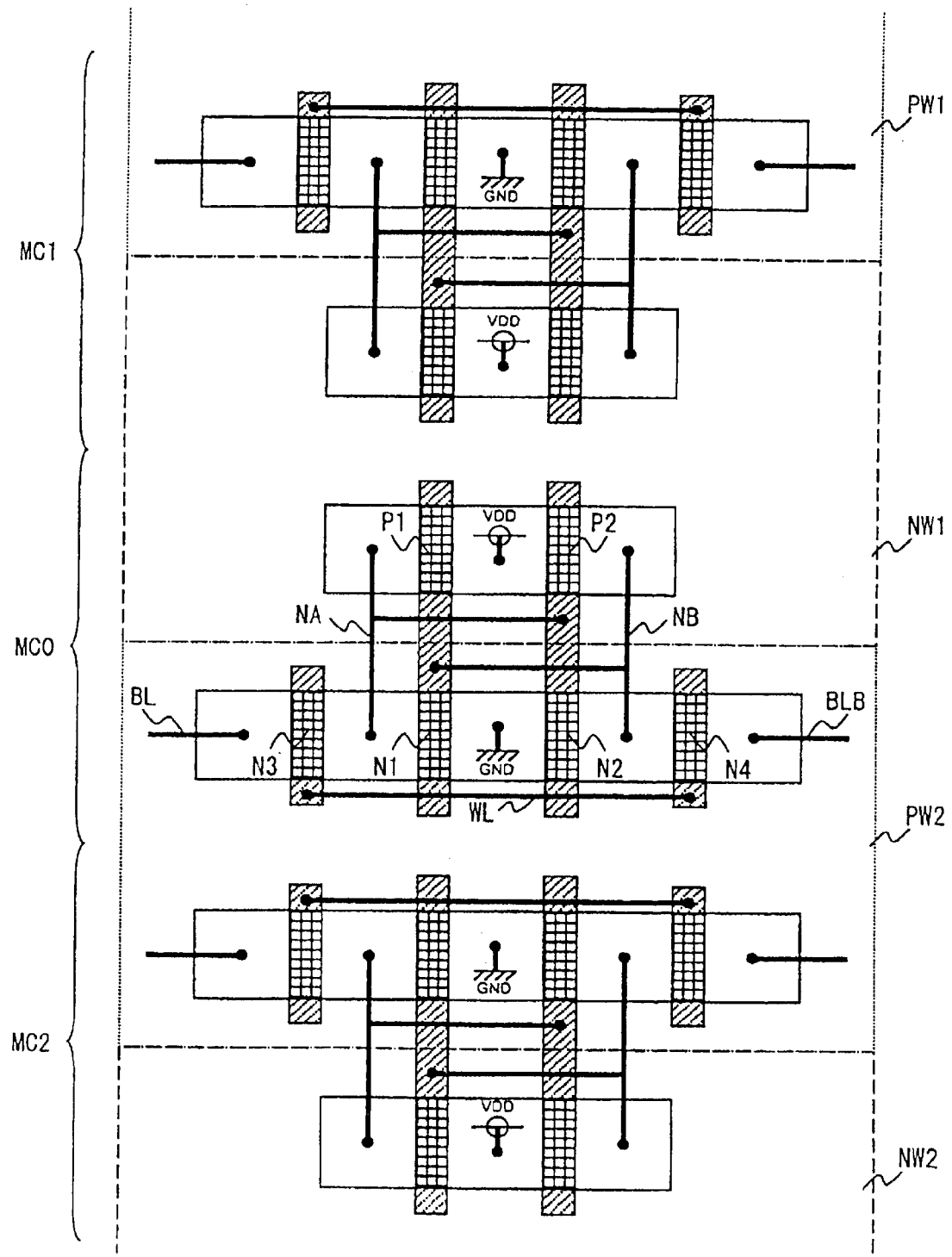
FIG. 12 is a diagram showing an example of the layout structure of a memory cell array constituted by the conventional SRAM memory cell.

Next, a semiconductor storage device according to a seventh embodiment will be described. The semiconductor storage device according to the seventh embodiment is such that the conventional SRAM memory cells shown in FIG. 11 are not provided opposite to each other between two SRAM memory cells as shown in FIG. 12 but a plurality of SRAM memory cells are provided in the same direction to constitute a memory cell array.

Figure 9:
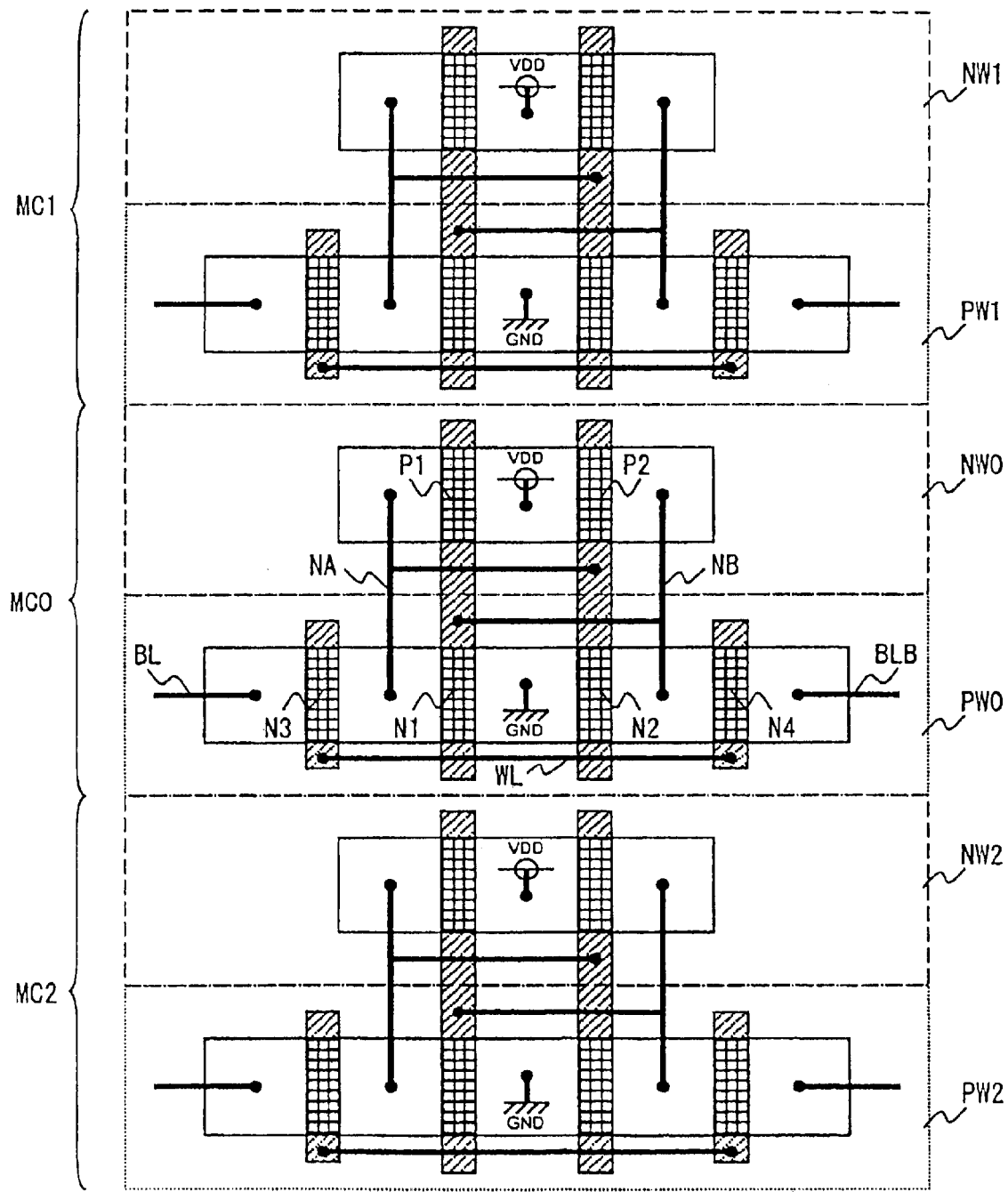
FIG. 9 is a diagram showing an example of the layout structure of a semiconductor storage device according to a seventh embodiment.

FIG. 9 is a diagram showing an example of the layout structure of the semiconductor storage device according to the seventh embodiment. In particular, FIG. 9 particularly shows three adjacent bits of the SRAM memory cells provided in a matrix and common portions to those in FIG. 11 have the same reference numerals and description thereof will be omitted. As shown in FIG. 9, memory cells MC0, MC1 and MC2 are provided in the same direction, respectively.

Consequently, a well region cannot be shared by the memory cells. To the contrary, the sharing is not required. Therefore, the area of a well region having the same conductivity type can be reduced. In other words, the quantity of electron and hole pairs generated by the irradiation of α rays or neutron rays can be decreased in the same well region. As a result, the quantity of minority carriers to be collected into a diffusion region constituting a storage node can be decreased. As compared with a conventional layout structure, consequently, the tolerance of a soft error can be enhanced.

As described above, according to the semiconductor storage device of the seventh embodiment, a plurality of conventional SRAM memory cells for one bit are provided in the same direction to constitute the memory cell array. Therefore, it is possible to decrease the area of the well region which is conventionally increased by sharing the same well region between the adjacent memory cells. As a result, it is possible to decrease the quantity of electron and hole pairs generated by the irradiation of the α rays or the neutron rays. Similarly, it is possible to reduce a danger that 2-bit hold data might be inverted. As a result, it is possible to reduce a possibility that a multi-bit error might be generated.

In the first, second, fifth and sixth embodiments described above, the impurity concentration of each of the dummy N+ diffusion region and the dummy P+ diffusion region may be higher than that of each of the N+ diffusion region and the P+ diffusion region which constitute a transistor circuit. For example, in FIG. 1, the N type impurity ion is implanted into the P well region PW through the same mask to form the N+ diffusion regions FL200, FL210, FL220, FL230, FL240 and FL250 at the same time, and furthermore, the N type ion is then implanted into only the N+ diffusion region FL250 by masking the portions of the N+ diffusion regions FL200, FL210, FL220, FL230 and FL240. Consequently, the impurity concentration of the N+ diffusion region 250 can be increased. Similarly, the P type impurity ion is implanted into the N well region through the same mask to form the P+ diffusion regions FL100, FL110, FL120 and FL150 at the same time, and furthermore, the P type ion is then implanted into only the P+ diffusion region FL150 by masking the portions of the P+ diffusion regions FL100, FL110 and FL120. Consequently, the impurity concentration of the P+ diffusion region FL150 can be increased.

Consequently, the electron and hole pairs generated in the well region can be attracted more greatly into the dummy N+ diffusion region and the dummy P+ diffusion region, and the N+ diffusion region and the P+ diffusion region which constitute the storage node can more greatly reduce a probability that a critical charge quantity is reached.

In the third, fourth, fifth and sixth embodiments described above, even if the impurity concentration of each of the dummy N well region and the dummy P well region may be higher than that of each of the N well region and the P well region which constitute a transistor circuit, the same effects as described above can be obtained. For example, in FIG. 3, the N type impurity ion is implanted into the silicon substrate through the same mask to form the N well regions NW and DNW at the same time, and furthermore, the N type ion is then implanted into only the dummy N well region DNW by masking the N well region NW. Consequently, the impurity concentration of the dummy N well region DNW can be increased. Similarly, the P type impurity ion is implanted into the silicon substrate through the same mask to form the P well regions PW and DPW at the same time, and furthermore, the P type ion is then implanted into only the dummy P well region DPW by masking the P well region PW. Consequently, the impurity concentration of the P well region DPW can be increased.

As described above, according to the present invention, a part of the electrons and holes generated in the first and second well regions by the irradiation of the α rays or the neutron rays can be collected into the dummy diffusion region. Consequently, it is possible to reduce a possibility that a soft error might be generated, that is, the electric charges stored by the collection of the electrons and holes might reach the critical charge quantity causing data inversion in the impurity diffusion region contributing to the storage operation.

Furthermore, the impurity diffusion region is formed to be shared by adjacent memory cells over the well region shared by both memory cells. As compared with the case in which the dummy impurity diffusion regions are individually formed, therefore, the area required for forming the dummy impurity diffusion region can be prevented from being increased. In addition, the storage nodes of the mutual memory cells can be divided by the dummy impurity diffusion region, and furthermore, the quantity of electric charges collected into the storage node of each memory cell can be decreased to reduce a possibility that a soft error might be generated. Moreover, it is possible to obtain the effect that the generation of a multi-bit error causing the inversion of 2-bit hold data can be reduced.

Furthermore, it is possible to reduce a possibility that the same soft error generation might be caused by the formation of the dummy impurity diffusion region also in the layout structure of the multi-port SRAM memory cell.

Furthermore, the dummy impurity diffusion region is formed between the two impurity diffusion regions provided apart from each other over the same well region in order to constitute a multi-port transistor storage circuit. Therefore, the electrons to be originally collected into both diffusion regions can be uniformly collected into the dummy N+ diffusion region. Thus, it is possible to obtain the effect that the tolerance of a soft error can be more enhanced.

Furthermore, for example, the longitudinal direction of the dummy impurity diffusion region is more lengthened to have the shape of a strip. Consequently, it is possible to obtain the effect that the dummy impurity diffusion region is shared between not only two memory cells provided opposite to each other but also a plurality of memory cells provided in a direction orthogonal to the opposite direction. Moreover, when a predetermined electric potential is to be applied to the dummy impurity diffusion region, the number of contacts required for connection to a predetermined electric potential line can be decreased, thereby simplifying the layout of the upper wiring layer to carry out the connection to the contacts. In addition, the area required for forming the contact and the wiring layer can be reduced. As a result, it is possible to obtain the effect that the size of each memory cell can be reduced.

Furthermore, it is possible to obtain the effect that the capability to collect electrons generated in the well region can be controlled by the application of the predetermined electric potential to the dummy third impurity diffusion region.

Furthermore, the power potential of the transistor storage circuit can be utilized as the predetermined electric potential to be applied to the dummy third impurity diffusion region. By utilizing an electric potential which is equal to or higher than the power potential, moreover, it is possible to obtain the effect that the capability to collect electrons generated in the well region can be more enhanced.

Furthermore, it is possible to obtain the effect that the capability to collect holes generated in the well region can be controlled by the application of the predetermined electric potential to the dummy fourth impurity diffusion region.

Furthermore, the ground potential of the transistor storage circuit can be utilized as the predetermined electric potential to be applied to the dummy fourth impurity diffusion region. By utilizing an electric potential which is equal to or lower than the ground potential, moreover, it is possible to obtain the effect that the capability to collect holes generated in the well region can be more enhanced.

Furthermore, the impurity concentration of the dummy third impurity diffusion region is set to be higher than that of the first impurity diffusion region constituting the transistor storage circuit. Consequently, it is possible to obtain the effect that the holes generated in the first well region can be more attracted into the dummy third impurity diffusion region and a probability that the first impurity diffusion region constituting the storage node might reach the critical charge quantity can be more reduced.

Furthermore, the impurity concentration of the dummy fourth impurity diffusion region is set to be higher than that of the second impurity diffusion region constituting the transistor storage circuit. Consequently, it is possible to obtain the effects that the electrons generated in the second well region can be more attracted into the dummy fourth impurity diffusion region and a probability that the second impurity diffusion region constituting the storage node might reach the critical charge quantity can be more reduced.

Furthermore, it is possible to decrease the quantity of electrons or holes generated on the first well region and the second well region by the irradiation of α rays or neutron rays corresponding to the areas of the dummy third well region (P well region) which does not contribute to a storage operation and the dummy fourth well region (N well region) which does not contribute to the storage operation. Consequently, it is possible to decrease the quantity of the electrons or holes collected onto the first well region and the second well region by the irradiation of the α rays or the neutron rays. As a result, the quantity of the electrons or holes collected into the impurity diffusion region can be decreased. Therefore, it is possible to reduce a possibility that a soft error might be generated in the impurity diffusion region which contributes to the storage operation.

Furthermore, the dummy third well region or the dummy fourth well region is formed between the adjacent memory cells. Therefore, the storage nodes of the mutual memory cells are divided by the dummy well region, and furthermore, it is possible to decrease the quantity of electric charges collected into the storage node of each memory cell, thereby reducing a possibility that a soft error might be generated. Moreover, it is possible to obtain the effect that the generation of a multi-bit error causing the inversion of 2-bit hold data can be reduced.

Furthermore, it is possible to reduce a possibility that the same soft error generation might be caused by the formation of the dummy well region also in the layout structure of the multi-port SRAM memory cell.

Furthermore, the dummy well region is formed between the two impurity diffusion regions provided apart from each other over the same well region in order to constitute a multi-port transistor storage circuit. Therefore, the quantity of the electrons collected into the two impurity diffusion regions can be decreased corresponding to the quantity of the electrons generated in the dummy well region. Thus, it is possible to obtain the effect that the tolerance of a soft error can be more enhanced.

Furthermore, for example, the longitudinal direction of the dummy well region is more lengthened to have the shape of a strip. Consequently, it is possible to obtain the effect that the dummy well region is shared between not only two memory cells provided opposite to each other but also a plurality of memory cells provided in a direction orthogonal to the opposite direction. Moreover, when a predetermined electric potential is to be applied to the dummy well region, the number of contacts required for connection to a predetermined electric potential line can be decreased, thereby simplifying the layout of the upper wiring layer to carry out the connection to the contacts. In addition, the area required for forming the contact and the wiring layer can be reduced. As a result, it is possible to obtain the effect that the size of each memory cell can be reduced.

Furthermore, it is possible to obtain the effect that the capability to collect electrons generated in the well region can be controlled by the application of the predetermined electric potential to the dummy third well region.

Furthermore, the power potential of the transistor storage circuit can be utilized as the predetermined electric potential to be applied to the dummy third well region. By utilizing an electric potential which is equal to or higher than the power potential, moreover, it is possible to obtain the effect that the capability to collect electrons generated in the well region can be more enhanced.

Furthermore, it is possible to obtain the effect that the capability to collect holes generated in the well region can be controlled by the application of the predetermined electric potential to the dummy fourth well region.

Furthermore, the ground potential of the transistor storage circuit can be utilized as the predetermined electric potential to be applied to the dummy fourth well region. By utilizing an electric potential which is equal to or lower than the ground potential, moreover, it is possible to obtain the effect that the capability to collect holes generated in the well region can be more enhanced.

Furthermore, the impurity concentration of the dummy third well region is set to be higher than that of the second well region constituting the transistor storage circuit. Consequently, it is possible to obtain the effect that the holes generated in the well region can be more attracted into the dummy third well region and a probability that the first impurity diffusion region constituting the storage node might reach the critical charge quantity can be more reduced.

Furthermore, the impurity concentration of the dummy fourth well region is set to be higher than that of the first well region constituting the transistor storage circuit. Consequently, it is possible to obtain the effects that the electrons generated in the well region can be more attracted into the dummy fourth well region and a probability that the second impurity diffusion region constituting the storage node might reach the critical charge quantity can be more reduced.

Furthermore, a plurality of conventional memory cells for one bit are arranged in the same direction to constitute a memory cell array. As compared with a well region which is conventionally increased by sharing the same well region by the adjacent memory cells, the area thereof can be decreased. As a result, it is possible to obtain the effect that the quantity of electron and hole pairs generated by the irradiation of the α rays or the neutron rays can be decreased and the tolerance of a soft error can be enhanced. Moreover, it is possible to reduce a possibility that a multi-bit error causing the inversion of 2-bit hold data might be generated.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor memory device comprising:
   a first transistor memory circuit including
      a first well region having a first conductivity type;
      a first impurity diffusion region on said first well region, wherein said first impurity diffusion region has a second conductivity type, different from the first conductivity type, as a first storage node of said first transistor memory circuit;
      a second well region adjacent to said first well region, said second well region having the second conductivity type; and
      a second impurity diffusion region on said second well region, said second impurity diffusion region having the first conductivity type, as a second storage node of said first transistor memory circuit,
   a third impurity diffusion region on said first well region, wherein said third impurity diffusion region has the second conductivity type, said third impurity diffusion region is not electrically connected to said first and second storage nodes, and no transistor element is located in said third impurity diffusion region; and
   a fourth impurity diffusion region on said second well region, wherein said fourth impurity diffusion region has the first conductivity type, said fourth impurity diffusion region is not electrically connected to said first and second storage nodes, and no transistor element is located in said fourth impurity diffusion region.

2. The semiconductor memory device according to claim 1, further comprising a fifth impurity diffusion region on the second well region as a multi-port of said first transistor memory circuit, wherein said fifth impurity diffusion region has the first conductivity type.

3. The semiconductor memory device according to claim 2, wherein said fourth impurity diffusion region is between said second and fifth impurity diffusion regions.

4. The semiconductor memory device according to claim 1, wherein said third impurity diffusion region is connected to a first electric potential line to which a predetermined electric potential is applied.

5. The semiconductor memory device according to claim 4, wherein the predetermined electric potential of said first electric potential line is at least equal to a power potential of said first transistor memory circuit.

6. The semiconductor memory device according to claim 1, wherein said fourth impurity diffusion region is connected to a second electric potential line to which a predetermined electric potential is applied.

7. The semiconductor memory device according to claim 6, wherein the predetermined electric potential of said second electric potential line is no higher than a ground potential.

8. The semiconductor memory device according to claim 1, wherein concentration of dopant impurities in said third impurity diffusion region is higher than that in said first impurity diffusion region.

9. The semiconductor memory device according to claim 1, wherein concentration of dopant impurities in said fourth impurity diffusion region is higher than that in said second impurity diffusion region.

10. A semiconductor memory device comprising:
    a first transistor memory circuit including
       a first well region having a first conductivity type;
       a first impurity diffusion region on said first well region, wherein said first impurity diffusion region has a second conductivity type, different from the first conductivity type, as a first storage node of said first transistor memory circuit;
       a second well region adjacent to said first well region, said second well region having the second conductivity type; and
       a second impurity diffusion region on said second well region, said second impurity diffusion region having the first conductivity type, as a second storage node of said first transistor memory circuit,
    a third well region adjacent to said first well region, wherein said third well region has the second conductivity type, and said third well region is not electrically connected to said first and second storage nodes; and
    a fourth well region adjacent to said second well region, wherein said fourth well diffusion region has the first conductivity type, and said fourth well region is not electrically connected to said first and second storage nodes.

11. The semiconductor memory device according to claim 10, further comprising a fifth impurity diffusion region on the second well region constituting a multi-port of said first transistor memory circuit, wherein said fifth impurity diffusion region has the first conductivity type.

12. The semiconductor memory device according to claim 11, wherein said fourth well region is between said second and fifth impurity diffusion regions.

13. The semiconductor memory device according to claim 10, wherein said third well region is connected to a first electric potential line to which a predetermined electric potential is applied.

14. The semiconductor memory device according to claim 13, wherein the predetermined electric potential of said first electric potential line is no higher than a power potential of said first transistor memory circuit.

15. The semiconductor memory device according claim 10, wherein the fourth well region is connected to a second electric potential line to which a predetermined electric potential applied.

16. The semiconductor memory device according to claim 15, wherein the predetermined electric potential of said second electric potential line is no higher than a ground potential.

17. The semiconductor memory device according to claim 10, wherein concentration of dopant impurities in said third well region is higher than that in said second well region.

18. The semiconductor memory device according to claim 10, wherein concentration of dopant impurities in said fourth well region is higher than that in said first well region.

19. A semiconductor memory device comprising:
- a plurality of transistor memory circuits, each transistor memory circuit including
  - a first well region having a first conductivity type;
  - a first impurity diffusion region on said first well region, wherein said first impurity diffusion region has a second conductivity type which is different from the first conductivity type, as a first storage node of each of said transistor memory circuits;
  - a second well region adjacent to said first well region, said second well region having the second conductivity type; and
  - a second impurity diffusion region on said second well region, said second impurity diffusion region having the first conductivity type as a second storage node of each of said transistor memory circuits;
- a third impurity diffusion region on said first well region, wherein said third impurity diffusion region has the second conductivity type, said third impurity diffusion region is not electrically connected to said first and second storage nodes, and no transistor element is located in said third impurity diffusion region; and
- a fourth impurity diffusion region on said second well region, wherein said fourth impurity diffusion region has the first conductivity type, said fourth impurity diffusion region is not electrically connected to said first and second storage nodes, and no transistor element is located in said fourth impurity diffusion region, wherein said transistor memory circuits are arranged in a direction which is perpendicular to boundary lines between respective pairs of said first and second well regions.

20. The semiconductor memory device according to claim 1, comprising second and third transistor memory circuits having the same configuration as the first transistor memory circuit and disposed on opposites sides of the first transistor memory circuit, wherein
- the first and second transistor memory circuit share said first well region and said first impurity diffusion region, and
- said first and third transistor memory circuits share said second well region and said second impurity diffusion region.

21. The semiconductor memory device according to claim 10, comprising second and third transistor memory circuits having the same configuration as the first transistor memory circuit and disposed on opposites sides of the first transistor memory circuit, wherein
- the first and second transistor memory circuit share said third well region, and
- said first and third transistor memory circuits share said fourth well region.

* * * * *